(12) United States Patent
Horisaki et al.

(10) Patent No.: US 11,412,118 B2
(45) Date of Patent: *Aug. 9, 2022

(54) ELECTROMAGNETIC WAVE PHASE/AMPLITUDE GENERATION DEVICE, ELECTROMAGNETIC WAVE PHASE/AMPLITUDE GENERATION METHOD, AND ELECTROMAGNETIC WAVE PHASE/AMPLITUDE GENERATION PROGRAM

(71) Applicant: Osaka University, Suita (JP)

(72) Inventors: Ryoichi Horisaki, Suita (JP); Jun Tanida, Suita (JP); Riki Egami, Suita (JP)

(73) Assignee: Osaka University, Suita (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/089,028

(22) Filed: Nov. 4, 2020

(65) Prior Publication Data

US 2021/0120156 A1 Apr. 22, 2021

Related U.S. Application Data

(63) Continuation of application No. 16/272,569, filed on Feb. 11, 2019, now Pat. No. 10,904,415, which is a (Continued)

(30) Foreign Application Priority Data

Aug. 15, 2016 (JP) .................. 2016-159312

(51) Int. Cl.
*H04N 5/225* (2006.01)
*G01J 9/00* (2006.01)
*G01N 21/47* (2006.01)

(52) U.S. Cl.
CPC .............. *H04N 5/2256* (2013.01); *G01J 9/00* (2013.01); *G01N 21/47* (2013.01)

(58) Field of Classification Search
CPC .......... H04N 5/2256; G01J 9/00; G01N 21/47
(Continued)

(56) References Cited

U.S. PATENT DOCUMENTS 6,064,473 A 5/2000 Hironaga et al.
7,012,738 B1 3/2006 Schwarte
(Continued)

FOREIGN PATENT DOCUMENTS

CN 102495467 A 6/2012
CN 104154878 A 11/2014
(Continued)

OTHER PUBLICATIONS

Choi, K. et al., Compressive holography of diffuse objects, Applied Optics, Optical Society of America, Washington, DC; US, vol. 49, No. 34, Dec. 1, 2010 (Dec. 1, 2010), pp. H1-H10, XP001559209, ISSN: 0003-6935, DOI: 10.1364/A0.49.0000H1.
(Continued)

*Primary Examiner* — Amir Shahnami
(74) *Attorney, Agent, or Firm* — Wilson Sonsini Goodrich & Rosati

(57) ABSTRACT

An electromagnetic wave phase/amplitude generation device includes a radiation unit configured to radiate electromagnetic waves of a random radiation pattern on a spatial frequency in which a state of the electromagnetic waves to be radiated for each divided region is determined to an imaging object, an imaging unit configured to generate a captured image by imaging scattered electromagnetic waves that are electromagnetic waves generated when the imaging object scatters the electromagnetic waves of the radiation pattern radiated by the radiation unit, and a generation unit
(Continued)

configured to generate information indicating at least a phase and amplitude of the electromagnetic waves from the imaging object by performing an arithmetic sparsity constraint operation according to sparsity of the imaging object on the basis of the captured image generated by the imaging unit, information indicating the radiation pattern, and information indicating a signal of the imaging object.

20 Claims, 23 Drawing Sheets

Related U.S. Application Data continuation of application No. PCT/JP2017/029156, filed on Aug. 10, 2017.

(58) Field of Classification Search
USPC .......................................................... 348/135
See application file for complete search history.

(56) References Cited

U.S. PATENT DOCUMENTS

| | | | |
|---|---|---|---|
| 7,217,573 | B1 | 5/2007 | Oshida et al. |
| 7,812,303 | B2 | 10/2010 | Meyers et al. |
| 10,761,011 | B2 | 9/2020 | Ota et al. |
| 10,904,415 | B2 | 1/2021 | Horisaki et al. |
| 2002/0041376 | A1 | 4/2002 | Kurozumi et al. |
| 2007/0151343 | A1 | 7/2007 | Gross et al. |
| 2009/0190121 | A1 | 7/2009 | Hegyi et al. |
| 2010/0170796 | A1 | 7/2010 | Bhatia et al. |
| 2010/0294916 | A1 | 11/2010 | Meyers et al. |
| 2012/0004514 | A1 | 1/2012 | Marugame |
| 2013/0155499 | A1 | 6/2013 | Dixon et al. |
| 2013/0176533 | A1 | 7/2013 | Raffle et al. |
| 2013/0329226 | A1 | 12/2013 | Matsubara et al. |
| 2014/0098359 | A1 | 4/2014 | Gross et al. |
| 2016/0033328 | A1 | 2/2016 | Walters |
| 2016/0131891 | A1 | 5/2016 | Higaki |
| 2016/0327779 | A1 | 11/2016 | Hillman et al. |
| 2017/0332933 | A1* | 11/2017 | Krishnaswamy .... A61B 5/4064 |
| 2018/0246030 | A1 | 8/2018 | Ota et al. |
| 2018/0327699 | A1 | 11/2018 | Ota et al. |
| 2019/0320100 | A1 | 10/2019 | Horisaki et al. |
| 2019/0339380 | A1 | 11/2019 | Marks |

FOREIGN PATENT DOCUMENTS

| | | | |
|---|---|---|---|
| CN | 104849874 | A | 8/2015 |
| CN | 105005053 | A | 10/2015 |
| CN | 105044897 | A | 11/2015 |
| CN | 105223582 | A | 1/2016 |
| EP | 3584564 | A1 | 12/2019 |
| JP | S613032 | A | 1/1986 |
| JP | S6279329 | A | 4/1987 |
| JP | H07270314 | A | 10/1995 |
| JP | H09311102 | A | 12/1997 |
| JP | 2002116133 | A | 4/2002 |
| JP | 3444509 | B2 | 9/2003 |
| JP | 2006520893 | A | 9/2006 |
| JP | 2009180725 | A | 8/2009 |
| JP | 2010203949 | A | 9/2010 |
| JP | 2013015357 | A | 1/2013 |
| JP | 2014013234 | A | 1/2014 |
| JP | 5534214 | B2 | 6/2014 |
| JP | 2014175819 | A | 9/2014 |
| JP | 2015052663 | A | 3/2015 |
| JP | 2016057172 | A | 4/2016 |
| WO | WO-2006127967 | A2 | 11/2006 |
| WO | WO-2007067999 | A2 | 6/2007 |
| WO | WO-2013066896 | A1 | 5/2013 |
| WO | WO-2014146062 | A2 | 9/2014 |
| WO | WO-2016038796 | A1 | 3/2016 |
| WO | WO-2016073985 | A1 | 5/2016 |

OTHER PUBLICATIONS

CN201680011390X Chinese Search Report dated Mar. 1, 2019.
CN201780062816.9 Patent Office Action dated Jul. 17, 2020.
EP16755545.7 Extended European Search Report dated Aug. 24, 2018.
EP16859965.2 European Search Report dated May 6, 2019.
EP17841464.5 Extended European Search Report dated Jan. 28, 2020.
Han, et al., Imaging cells in flow cytometer using spatial-temporal transformation. Scientific Reports, Aug. 18, 2015; vol. 5, No. 1: XP055477357.
Horisaki, et al., Single-pixel compressive diffractive imaging. Applied optics, Feb. 10, 2017, vol. 56, No. 5; 1353-1357.
Horisaki, et al., Single-pixel compressive diffractive imaging with structured illumination. Applied Optics, May 10, 2017, vol. 56 No. 14; 4085-4089.
International Search Report of PCT/JP2016/055412, dated May 17, 2016.
International Search Report of PCT/JP2016/082089, dated Jan. 24, 2017.
Katkovnik V, Astola J, Compressive sensing computational ghost imaging, J.Opt. Soc. Am. A, Jul. 12, 2012, vol. 29, No. 8, pp. 1556-1567.
Katkovnik V, Astola J, Phase retrieval via spatial light modulator phase modulation in 4f optical setup: numerical inverse imaging with sparse regularization for phase and amplitude, J. Opt. Soc. Am. A, Dec. 19, 2011, vol. 29, No. 1, pp. 105-116.
Li, et al., Ghost imaging for an axially moving target with an unknown constant speed, Photonics Research, Aug. 2015; 3(4):153-157.
Li, et al., Ghost imaging of a moving target with an unknown constant speed, Applied Physics Letters, 2014; 104:251120-1-251120-3.
Liutkus, A. et al. Imaging With Nature: A Universal Analog Compressive Imager Using a Multiply Scattering Medium, Sep. 2, 2013 (Sep. 2, 2013), XP055194020, Retrieved from the Internet: URL:http://arxiv.org/vc/arxiv/papers/1309/1309.0425v1.pdf.
Liutkus, et al., Imaging with nature: compressive imaging using a multiply scattering medium. Scientific Reports, Jul. 9, 2014; vol. 4, Document No. 5552: pp. 1-7.
PCT/JP2017/029156 International Search Report dated Oct. 31, 2017.
R. Horisaki et al., Single-shot phase imaging with a coded aperture, Opticsletters, vol. 39, No. 22, Nov. 15, 2014.
Shibuya, et al., Monomolecular fluorescence imaging method based on ghost imaging by using circulatory pattern (second report), 2014: 863-864.
U.S. Appl. No. 15/552,438 Office Action dated Apr. 12, 2019.
U.S. Appl. No. 15/552,438 Office Action dated Aug. 9, 2018.
U.S. Appl. No. 15/771,180 Office Action dated Apr. 23, 2019.
U.S. Appl. No. 16/272,569 Notice of Allowance dated Aug. 12, 2020.
U.S. Appl. No. 16/272,569 Office Action dated Apr. 16, 2020.
Zhang, et al., Study on ghost imaging via compressive sensing for a reflected object, Optik, 2013;124:2334-2338.

* cited by examiner

ELECTROMAGNETIC WAVE PHASE/AMPLITUDE GENERATION DEVICE, ELECTROMAGNETIC WAVE PHASE/AMPLITUDE GENERATION METHOD, AND ELECTROMAGNETIC WAVE PHASE/AMPLITUDE GENERATION PROGRAM

CROSS-REFERENCE

This application is a continuation application of U.S. application Ser. No. 16/272,569, filed Feb. 11, 2019, now U.S. Pat. No. 10,904,415, which is a continuation application of International Application No. PCT/JP2017/029156, filed Aug. 10, 2017, which claims priority to Japanese Application No. 2016-159312, filed Aug. 15, 2016, each of which is entirely incorporated herein by reference.

TECHNICAL FIELD

The present invention relates to an electromagnetic wave phase/amplitude generation device, an electromagnetic wave phase/amplitude generation method, and an electromagnetic wave phase/amplitude generation program.

BACKGROUND ART

Conventionally, technology for radiating electromagnetic waves to an imaging object, imaging scattered electromagnetic waves generated when the imaging object scatters the radiated electromagnetic waves via a scattering plate having a random pattern in which a magnitude for attenuating the electromagnetic waves differs according to each region, and generating complex amplitude indicating a phase and amplitude of the electromagnetic waves scattered by the imaging object from a captured image and the random pattern is known (for example, Non-Patent Document 1).

CITATION LIST

Non-Patent Literature

[Non-Patent Document 1]
Single-shot phase imaging with a coded aperture (OPTICS LETTERS/Vol. 39, No. 22/Nov. 15, 2014)

SUMMARY OF INVENTION

Technical Problem

In the conventional technology, it is possible to generate complex amplitude indicating a phase and amplitude of electromagnetic waves scattered by an imaging object in one imaging process. However, a scattering plate weakens the electromagnetic waves scattered from the imaging object, a signal-to-noise ratio decreases, and noise increases. Also, if a state of the electromagnetic waves radiated to the imaging object is strengthened by an amount corresponding to the electromagnetic waves weakened by the scattering plate, there is a problem in that invasiveness with respect to the imaging object becomes high and the imaging object is adversely affected due to this high invasiveness.

An objective of the present invention is to provide an electromagnetic wave phase/amplitude generation device, an electromagnetic wave phase/amplitude generation method, and an electromagnetic wave phase/amplitude generation program having a high signal-to-noise ratio and low invasiveness to an imaging object.

Solution to Problem

According to an aspect of the present invention, there is provided an electromagnetic wave phase/amplitude generation device including: a radiation unit configured to radiate electromagnetic waves of a random radiation pattern on a spatial frequency in which a state of the electromagnetic waves to be radiated for each divided region is determined to an imaging object; an imaging unit configured to generate a captured image by imaging scattered electromagnetic waves that are electromagnetic waves generated when the imaging object scatters the electromagnetic waves of the radiation pattern radiated by the radiation unit; and a generation unit configured to generate information indicating at least a phase and amplitude of the electromagnetic waves from the imaging object by performing an arithmetic sparsity constraint operation according to sparsity of the imaging object on the basis of the captured image generated by the imaging unit, information indicating the radiation pattern, and information indicating a signal of the imaging object.

Also, according to an aspect of the present invention, in the electromagnetic wave phase/amplitude generation device, the information indicating the radiation pattern includes distance-specific wavefront pattern information indicating states of wavefronts of the electromagnetic waves at a plurality of distances and the generation unit is configured to generate information indicating a phase and amplitude of a tomographic plane of the imaging object by performing the arithmetic sparsity constraint operation according to the sparsity of the imaging object further on the basis of the distance-specific wavefront pattern information.

Also, according to an aspect of the present invention, in the electromagnetic wave phase/amplitude generation device, the generation unit is configured to generate the information indicating at least the phase and the amplitude of the electromagnetic waves by iteratively generating the information indicating at least the phase and the amplitude of the electromagnetic waves on the basis of the generated information indicating at least the phase and the amplitude of the electromagnetic waves and information indicating a signal of the imaging object.

Also, according to an aspect of the present invention, in the electromagnetic wave phase/amplitude generation device, first resolution that is resolution of the imaging unit is lower than second resolution that is resolution of the arithmetic sparsity constraint operation of the generation unit, and the generation unit is configured to generate the information indicating at least the phase and the amplitude of the electromagnetic waves at resolution higher than the first resolution by iteratively generating the information indicating at least the phase and the amplitude of the electromagnetic waves further on the basis of a correspondence relationship between the first resolution and the second resolution.

Also, according to an aspect of the present invention, in the electromagnetic wave phase/amplitude generation device, the random radiation pattern on the spatial frequency is a pattern in which a spectrum uniformly spreads on the spatial frequency.

Also, according to an aspect of the present invention, in the electromagnetic wave phase/amplitude generation device, the electromagnetic waves include at least one selected from the group consisting of visible rays, X rays, electron rays, ultraviolet rays, infrared rays, terahertz waves, millimeter waves, and microwaves.

Also, according to an aspect of the present invention, there is provided an electromagnetic wave phase/amplitude generation method including: a radiation step of radiating electromagnetic waves of a random radiation pattern on a spatial frequency in which a state of the electromagnetic waves to be radiated for each divided region is determined to an imaging object; an imaging step of generating a captured image by imaging scattered electromagnetic waves that are electromagnetic waves generated when the imaging object scatters the electromagnetic waves of the radiation pattern radiated from the radiation step; and a generation step of generating information indicating at least a phase and amplitude of the electromagnetic waves from the imaging object by performing an arithmetic sparsity constraint operation according to sparsity of the imaging object on the basis of the captured image generated from the imaging step, information indicating the radiation pattern, and information indicating a signal of the imaging object.

Also, according to an aspect of the present invention, there is provided an electromagnetic wave phase/amplitude generation program for causing a computer to execute: a radiation step of radiating electromagnetic waves of a random radiation pattern on a spatial frequency in which a state of the electromagnetic waves to be radiated for each divided region is determined to an imaging object; an imaging step of generating a captured image by imaging scattered electromagnetic waves that are electromagnetic waves generated when the imaging object scatters the electromagnetic waves of the radiation pattern radiated from the radiation step; and a generation step of generating information indicating at least a phase and amplitude of the electromagnetic waves from the imaging object by performing an arithmetic sparsity constraint operation according to sparsity of the imaging object on the basis of the captured image generated from the imaging step, information indicating the radiation pattern, and information indicating a signal of the imaging object.

Advantageous Effects of Invention

According to the present invention, it is possible to provide an electromagnetic wave phase/amplitude generation device, an electromagnetic wave phase/amplitude generation method, and an electromagnetic wave phase/amplitude generation program having a high signal-to-noise ratio and low invasiveness to an imaging object.

DESCRIPTION OF EMBODIMENTS

First Embodiment

Hereinafter, an embodiment of an electromagnetic wave phase/amplitude generation device will be described with reference to the drawings.

[Configuration of Electromagnetic Wave Phase/Amplitude Generating Device]

Figure 1:
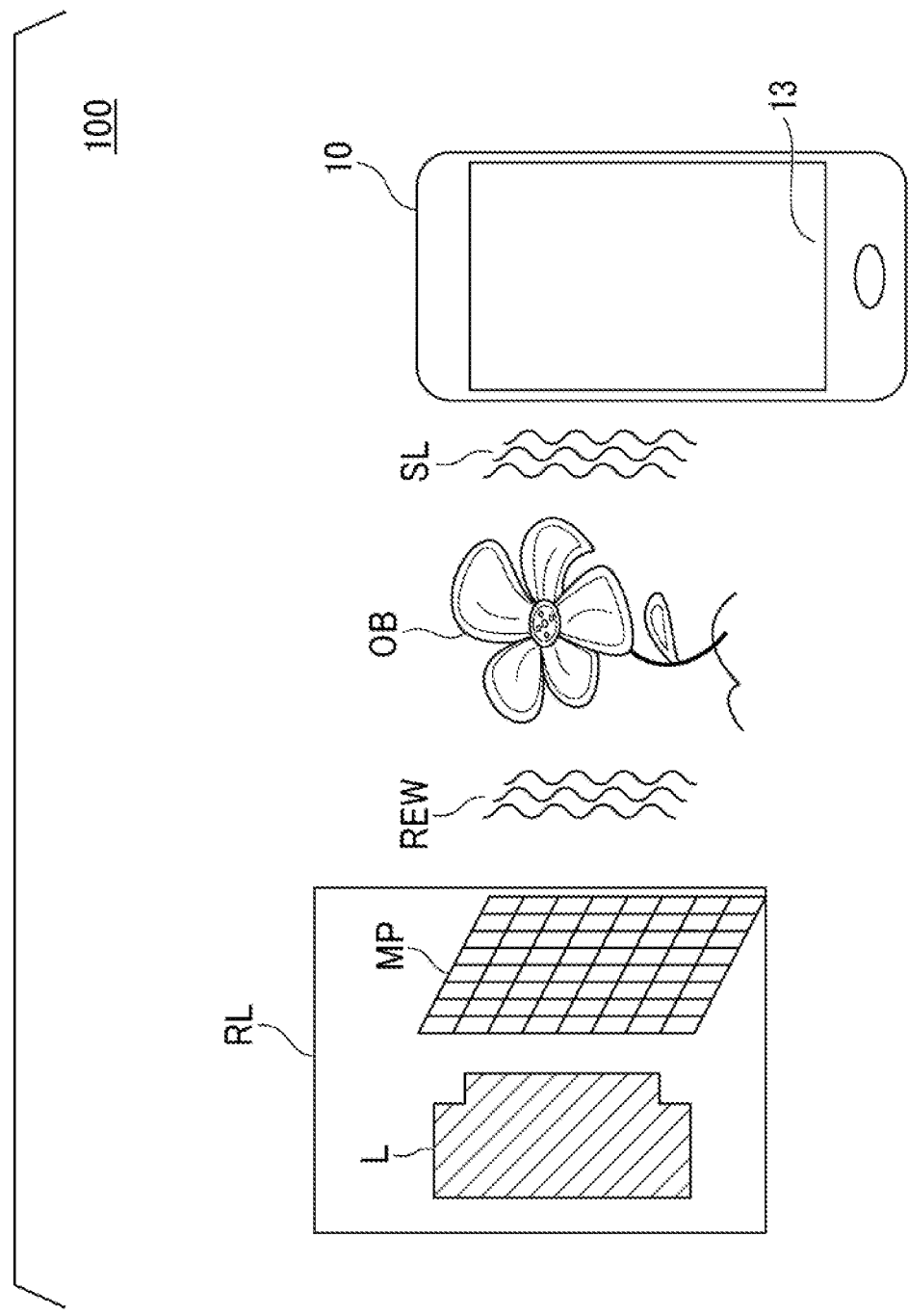
FIG. 1 is a diagram showing an example of an exterior configuration of an electromagnetic wave phase/amplitude generation device.

FIG. 1 is a diagram showing an example of an exterior configuration of an electromagnetic wave phase/amplitude generation device 100.

The electromagnetic wave phase/amplitude generation device 100 includes a radiation unit RL and a terminal device 10.

Electromagnetic waves radiated from the radiation unit RL are radiated to an imaging object OB. The imaging object OB is a sample to be observed by the electromagnetic wave phase/amplitude generation device 100. Specifically, the imaging object OB includes raw materials and materials that are an opaque and colorless transparent biological sample and a non-biological sample, and the like. Here, the electromagnetic waves include at least one of the group consisting of visible rays, X rays, electron rays, ultraviolet rays, infrared rays, terahertz waves, millimeter waves, and microwaves. Also, the above-described electromagnetic waves are not limited thereto and electromagnetic waves with any wavelength may be used. In this example, a case in which the electromagnetic waves are visible rays will be described. In the following description, visible rays may be simply described as light. Also, in the following description, light radiated from the radiation unit RL is also referred to as radiated light REW. The terminal device 10 captures the scattered light SL scattered by the imaging object OB as a captured image. In this example, the terminal device 10 is a terminal including an imaging device such as a smartphone.

The radiation unit RL includes an illumination lamp L and a scattering plate MP. The radiation unit RL radiates electromagnetic waves of a random radiation pattern on a spatial frequency in which a state of the electromagnetic waves to be radiated for each divided region is determined to an imaging object. The state of the electromagnetic waves includes states of an intensity, amplitude, and a phase of the electromagnetic waves. The states of the intensity and the amplitude of the electromagnetic waves are the state of the intensity of the electromagnetic waves. The state of the phase of the electromagnetic waves is a state of a delay or advance in the waves of the electromagnetic waves.

The spatial frequency is a spatial frequency in a captured image captured by the terminal device 10. Light emitted from the illumination lamp L is incident on the scattering plate MP and is radiated from the scattering plate MP to the imaging object OB using scattered light of an intensity according to a light scattering rate differing according to each region of the scattering plate MP as the radiated light REW.

Specifically, the illumination lamp L emits light. The light emitted from the illumination lamp L is radiated to the imaging object OB via the scattering plate MP. The illumination lamp L is a light source that emits light having higher coherence than light whose phase and amplitude randomly change. In other words, the light source with high coherence is a light source having a correlation with the phase and the amplitude of the light emitted from the light source. More specifically, the illumination lamp L is a laser light source, a semiconductor laser light source, or a light emitting diode (LED) light source.

The light emitted from the illumination lamp L is radiated to the scattering plate MP. The scattering plate MP scatters the light emitted from the illumination lamp L. The scattering plate MP radiates the scattered light as the radiated light REW to the imaging object OR. The scattering plate MP is a plate that changes an intensity of light radiated from the illumination lamp L for each region. The scattering plate MP is an optical element that modulates at least one of the group consisting of the intensity of electromagnetic waves, the amplitude of electromagnetic waves, and the phase of electromagnetic waves. In this example, the scattering plate MP is a spatial light modulator.

The scattering plate MP has a region divided so that a degree of light scattering differs. Here, the region is a region having a size corresponding to that of the imaging object OB. In this example, the scattering plate MP has a region divided into squares. Also, the region divided so that the degree of light scattering differs has a pattern in which a light scattering rate differs. Specifically, the scattering plate MP is a scattering plate that randomizes only the intensity of electromagnetic waves and makes the phase of electromagnetic waves constant. Also, the scattering plate MP may be a scattering plate that makes the intensity of electromagnetic waves constant and randomizes only the phase of electromagnetic waves. The scattering plate MP may be a scattering plate which randomizes the intensity of electromagnetic waves and the phase of electromagnetic waves.

Here, in the example of the present embodiment, the pattern in which the light scattering rate of the scattering plate MP is different is a pattern of a region where the light radiated to the imaging object OB is incident, but is a pattern in which a spectrum uniformly spreads on the spatial frequency. In other words, the pattern in which the light scattering rate of the scattering plate MP is different is a pattern of a region where the light radiated to the imaging object OB is incident, but is a pattern that does not have a peak except for an origin on the spatial frequency.

Specifically, the pattern in which the light scattering rate of the scattering plate MP is different is a white noise-like pattern on the spatial frequency. The white noise-like pattern is a pattern in which hardly any periodicity is observable. In other words, the pattern in which the light scattering rate of the scattering plate MP is different need not be a pattern having no peak at all on the spatial frequency or a pattern in which a spectrum evenly spreads on the spatial frequency.

The terminal device 10 includes a display unit 13. The terminal device 10 images the scattered light SL scattered by the imaging object OB to which the radiated light REW is radiated. The scattered light SL scattered by the imaging object OB is information indicating a signal of the imaging object OB. The terminal device 10 generates information indicating at least the phase and the amplitude of the scattered light SL from the imaging object OB on the basis of the captured image of the scattered light SL and the information indicating the random radiation pattern of the scattering plate MP. In the following description, the information indicating at least the phase and the amplitude of the scattered light SL from the imaging object OB may be referred to as complex amplitude information.

The display unit 13 displays the intensity, the phase and the amplitude of the scattered light SL on the basis of the information indicating at least the phase and the amplitude of the scattered light SL generated by the terminal device 10. Specifically, the display unit 13 displays the complex amplitude information generated by the generation unit 12. Also, the display unit 13 displays reconstructed information about an image according to the complex amplitude information from the generation unit 12. In this example, specifically, the display unit 13 is a liquid crystal display.

[Example of Configuration of Electromagnetic Wave Phase/Amplitude Generation Device]

Next, an example of the configuration of the electromagnetic wave phase/amplitude generation device 100 according to the present embodiment will be described with reference to FIG. 2.

Figure 2:
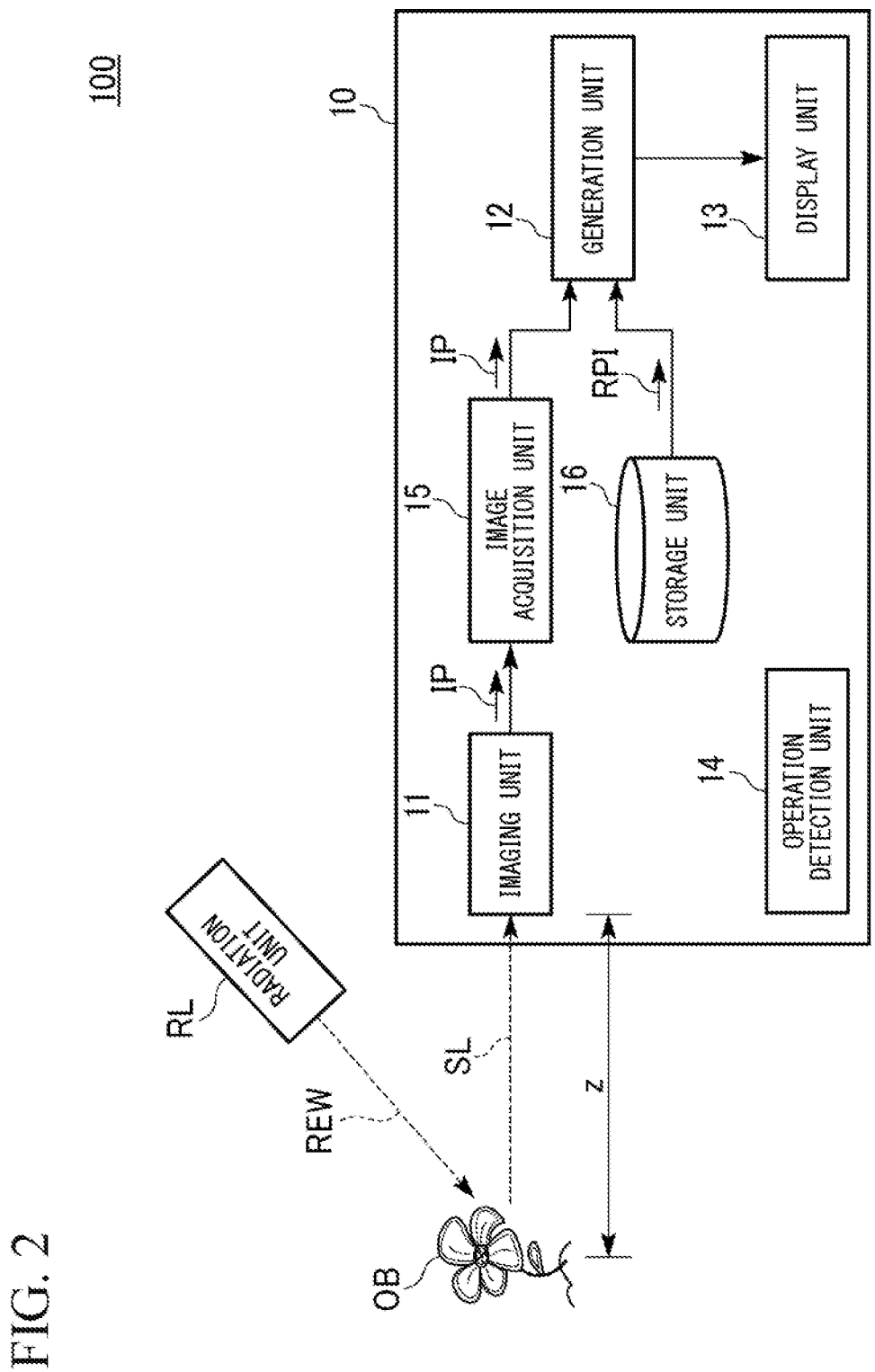
FIG. 2 is a diagram showing an example of a functional configuration of the electromagnetic wave phase/amplitude generation device.

FIG. 2 is a diagram showing an example of a functional configuration of the electromagnetic wave phase/amplitude generation device 100. The radiation unit RL and the imaging object OB are similar to those described above.

The terminal device 10 includes an operation detection unit 14, an imaging unit 11, an image acquisition unit 15, the generation unit 12, a storage unit 16, and the display unit 13.

The operation detection unit 14 detects an operation from a user who operates the electromagnetic wave phase/amplitude generation device 100. More specifically, when the radiated light REW is radiated from the radiation unit RL to the imaging object OB, the operation detection unit 14 detects that the user has performed a radiation command operation. The operation detection unit 14 detecting the radiation command from the user outputs a command for radiating the radiated light REW to the radiation unit RL.

The imaging unit 11 includes an imaging element (not shown). The imaging element captures the scattered light SL scattered by the imaging object OB. Specifically, the imaging element has a plurality of pixels. The imaging element accumulates charges corresponding to the amplitude of the scattered light SL or the intensity of the scattered light SL in the pixels. The imaging unit 11 images the scattered light SL on the basis of the charges accumulated in the imaging element. In the following description, the imaging element has pixels including y pixels in a lateral direction and x pixels in a longitudinal direction. A distance between the imaging object OB and the imaging element included in the imaging unit 11 is a distance z. The imaging unit 11 generates a captured image IP obtained by capturing the scattered light SL. The imaging unit 11 outputs the captured image IP generated from the scattered light SL to the image acquisition unit 15. In the following description, the captured image IP is information indicating the intensity of the scattered light SL.

The image acquisition unit 15 acquires the captured image IP from the imaging unit 11. The image acquisition unit 15 outputs the captured image IP acquired from the imaging unit 11 to the generation unit 12.

The storage unit 16 stores pattern information RPI indicating a random radiation pattern of the scattering plate MP.

The generation unit 12 acquires the captured image IP from the imaging unit 11. The generation unit 12 acquires the pattern information RPI stored in the storage unit 16.

On the basis of the captured image IP generated by the imaging unit 11, the pattern information RPI, and the information indicating the scattered light SL, the generation unit 12 generates information indicating at least a phase and amplitude of the scattered light SL from the imaging object OB. The generation unit 12 generates the information indicating the phase and the amplitude by performing an arithmetic sparsity constraint operation according to sparsity of the imaging object OB. The information indicating the phase and the amplitude generated by the generation unit 12 is complex amplitude information of the scattered light SL. The generation unit 12 generates information P indicating the phase of the scattered light SL and information VA indicating the amplitude of the scattered light SL on the basis of the generated complex amplitude information.

The generation unit 12 outputs the generated information indicating the phase and the amplitude, the information P indicating the phase of the scattered light SL, and the information VA indicating the amplitude of the scattered light SL to the display unit 13.

The display unit 13 displays the information indicating the phase and the amplitude acquired from the generation unit 12, the information P indicating the phase of the scattered light SL, and the information VA indicating the amplitude of the scattered light SL.

[Overview of Operation of Electromagnetic Wave Phase/Amplitude Generation Device]

Next, the overview of the operation of the electromagnetic wave phase/amplitude generation device 100 will be described with reference to FIG. 3.

Figure 3:
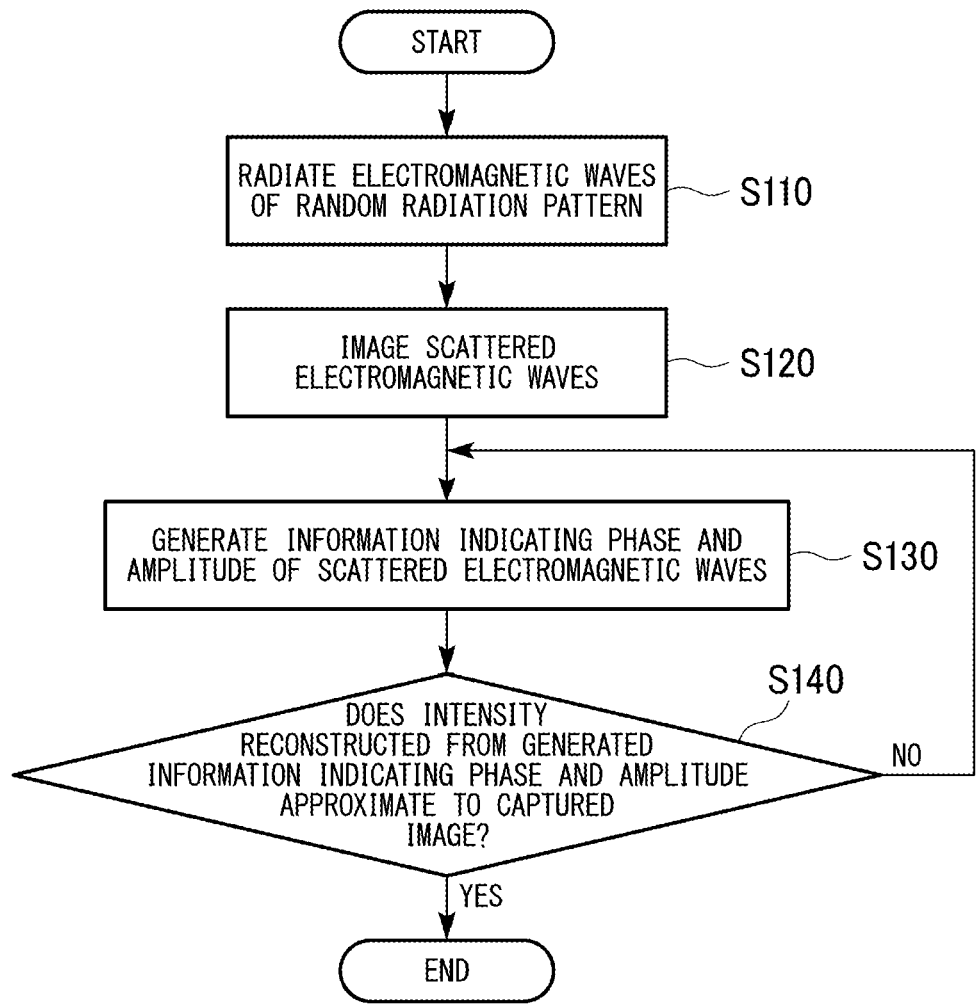
FIG. 3 is a flowchart showing an example of an operation of the electromagnetic wave phase/amplitude generation device.

FIG. 3 is a flowchart showing an example of the operation of the electromagnetic wave phase/amplitude generation device 100.

The radiation unit RL radiates electromagnetic waves of a random radiation pattern to the imaging object OB (step S110). The imaging unit 11 images the scattered light SL scattered by the imaging object OB as a captured image IP (step S120).

The imaging unit 11 outputs the captured image IP to the generation unit 12. The generation unit 12 acquires the captured image IP. The generation unit 12 obtains pattern information RPI indicating the radiation pattern from the storage unit 16. The generation unit 12 generates information indicating the phase and the amplitude of the scattered light SL by performing an arithmetic sparsity constraint operation on the basis of sparsity of the imaging object OB according to the captured image IP acquired from the imaging unit 11 and the pattern information RPI acquired from the storage unit 16.

Specifically, the generation unit 12 generates information indicating the phase and the amplitude of the scattered light SL from Eq. (1) and Eq. (2).

[Math. 1]

$$|g|^2 = |P_z M f|^2 \tag{1}$$

Eq. (1) is an equation indicating a problem to be predicted using a forward problem, i.e., a mathematical model.

[Math. 2]

$$\hat{f} = \operatorname*{argmin}_{f} \||g|^2 - |P_z M f|^2\|_{\ell_2} + \tau R(f) \tag{2}$$

Eq. (2) is an equation indicating an inverse problem, i.e., a problem for estimating a mathematical model from data.

x and y included in Eq. (1) and Eq. (2) are numbers corresponding to x pixels in the longitudinal direction and y pixels in the lateral direction as the number of pixels included in the image sensor. x and y in the following equations are also similar.

$|g|^2$ included in Eq. (1) and Eq. (2) is the captured image IP captured by the imaging element. Specifically, the captured image IP is information obtained by squaring an absolute value of the amplitude of the scattered light SL.

g included in Eq. (1) and Eq. (2) is complex amplitude information indicating the phase and the amplitude of the scattered light SL. In the following description, the complex amplitude information indicating the phase and the amplitude of the scattered light SL may be simply referred to as complex amplitude information g. More specifically, g is a matrix shown in Eq. (3). The same also applies to g in the following mathematical expressions.

[Math. 3]

$$g \in C^{(Nx \times Ny) \times 1} \tag{3}$$

$P_z$ included in Eq. (1) and Eq. (2) is a Toeplitz matrix of Fresnel propagation at a distance z between the imaging object OB and the imaging element. More specifically, $P_z$ is a matrix shown in Eq. (4). The same also applies to $P_z$ in the following mathematical expression.

[Math. 4]

$$P_z \in C^{(Nx \times Ny) \times (Nx \times Ny)} \tag{4}$$

M included in Eq. (1) and Eq. (2) is a matrix indicating the pattern information RPI of the scattering plate MP. Specifically, M is a matrix shown in Eq. (5). The same also applies to M in the following mathematical expression. In this example, the pattern information RPI is information indicating a pattern of the scattering plate MP according to numerical values from 0 indicating that the radiated light is not scattered to 1 indicating that light is scattered with an intensity of light as it is.

[Math. 5]

$$M \in C^{(Nx \times Ny) \times (Nx \times Ny)} \tag{5}$$

f included in Eq. (1) and Eq. (2) is information indicating a signal of the imaging object OB. More specifically, f is a matrix shown in Eq. (6). The same also applies to f in the following mathematical expression.

[Math. 6]

$$f \in C^{(Nx \times Ny) \times 1} \tag{6}$$

Here, $l_2$ included in Eq. (2) is $l_2$ norm. The same also applies to $l_2$ in the following mathematical expression.

R(f) included in Eq. (2) is sparsity constraint. Specifically, R(f) is a regular rule according to the sparsity of information indicating the signal of the imaging object OB. τ included in Eq. (2) is a parameter for the regular rule. The same also applies to R(f) and τ in the following mathematical expression.

That is, the generation unit 12 generates the complex amplitude information g of the scattered light SL by performing an arithmetic sparsity constraint operation according to the sparsity of the imaging object OB (step S130). Also, the generation unit 12 generates the arithmetic sparsity constraint operation according to a well-known technique. For example, the generation unit 12 performs the arithmetic sparsity constraint operation using a well-known sparse solver.

The generation unit 12 reconstructs the intensity of the scattered light SL on the basis of the generated complex amplitude information g.

Specifically, the generation unit 12 reconstructs information indicating the intensity of the scattered light SL from the square of the absolute value of the generated complex amplitude information g. The generation unit 12 compares the reconstructed information indicating the intensity of the scattered light SL with the captured image obtained by imaging the imaging object OB in the imaging unit 11 (step S140). When the reconstructed information indicating the intensity of the scattered light SL approximates to the captured image obtained by imaging the imaging object OB in the imaging unit 11, the process is ended (step S140; YES). When the reconstructed information indicating the intensity of the scattered light SL does not approximate to the captured image obtained by imaging the imaging object OB in the imaging unit 11, the processing of step S130 is iterated by substituting the generated complex amplitude information g into Eq. (1) and Eq. (2) (step S140; NO). The generation unit 12 may use well-known technology in a method of comparing the reconstructed information indicating the intensity of the scattered light SL with a captured image obtained by the imaging unit 11 imaging the imaging object OB. Also, it may be determined whether or not the reconstructed information indicating the intensity of the scattered light SL approximates to the captured image according to visual observation of the user using the method of comparing the reconstructed information indicating the intensity of the scattered light SL with the captured image obtained by the imaging unit 11 imaging the imaging object OB.

[Specific Example of Operation of Electromagnetic Wave Phase/Amplitude Generation Device]

The overview of the operation of the generation unit 12 has been described above. The generation unit 12 generates the complex amplitude information g by solving Eq. (1) and Eq. (2). When Eq. (1) and Eq. (2) are solved, the electromagnetic wave phase/amplitude generation device 100 may not be easily solved because the forward problem shown in Eq. (1) is a nonlinear problem.

Here, an example of a method of generating the complex amplitude information g will be described.

[Solution According to Auxiliary Plane]

In the following description, the generation unit 12 generates the complex amplitude information g according to alternating projection.

The generation unit 12 sets an auxiliary plane a between the imaging object OB and the imaging element. Assuming the auxiliary plane a, Eq. (1) can be expressed by Eq. (7) and Eq. (8).

[Math. 7]

$$|g|^2 = |P_{z_2} P_{z_1} Mf|^2 \tag{7}$$

Here, $z_1$ included in Eq. (7) is the distance between the imaging object OB and the auxiliary plane a.

$z_2$ included in Eq. (7) is the distance between the auxiliary plane a and the imaging element. A sum of the distance $z_1$ and the distance $z_2$ is the distance z between the imaging object OB and the imaging element. In other words, the auxiliary plane a is complex amplitude information assumed at a position separated by the distance $z_1$ from the imaging object OB and the distance $z_2$ from the imaging element.

[Math. 8]

$$a = P_{z_1} Mf \tag{8}$$

Eq. (8) is an equation when the distance between the imaging object OB and the auxiliary plane a is $z_1$. As shown in Eq. (8), the auxiliary plane a is generated by solving a linear problem.

Also, the auxiliary plane a is generated by an inverse Fresnel transform of g of temporary placing generated from Eq. (9) to be described below. That is, the generation unit 12 can generate the complex amplitude information g by solving a phase estimation problem.

[Math. 9]

$$\hat{g} = \underset{g}{\operatorname{argmin}} \| |g|^2 - |P_{z_2} a|^2 \|_{l_2} \tag{9}$$

The generation unit 12 sets a temporary value in the complex amplitude information g as an initial value. The temporary value of the complex amplitude information g that is the initial value may be any value. The generation unit 12 substitutes the auxiliary plane g in which the temporary value is set into Eq. (9). The generation unit 12 generates g of temporary placing according to a G-S method in Eq. (9). The G-S method is an iterative phase estimation method.

[Math. 10]

$$\hat{g}(|g|^2 \oslash |P_{z_2} a|^2)^{\frac{1}{2}} \otimes P_{z_2} a \qquad (10)$$

Eq. (10) is an equation obtained by modifying Eq. (9). The generation unit 12 generates g of temporary placing according to Eq. (10). Also, as shown in Eq. (10), the generation unit 12 divides the captured image IP by an element unit according to the complex amplitude information at the position of the distance $z_2$ and the intensity of the auxiliary plane a.

The generation unit 12 generates g of temporary placing by multiplying a value obtained by multiplying the square root of a value divided by the element unit by the complex amplitude information and the auxiliary plane a at a position of the distance $z_2$ in units of elements. The generation unit 12 generates an auxiliary plane a of temporary placing by performing an inverse Fresnel transform on generated g of temporary placing.

[Math. 11]

$$\hat{f} = \underset{f}{\mathrm{argmin}} \|a - P_{z_1} M f\|_{l_2} + \tau R(f) \qquad (11)$$

The generation unit 12 substitutes the auxiliary plane a of temporary placing generated from Eq. (10) into Eq. (11). The generation unit 12 generates f of temporary placing by solving Eq. (11) using a TwIST method. The TwIST method is a general solution of compression sensing.

The generation unit 12 causes f of temporary placing to be propagated. The generation unit 12 generates the auxiliary plane a from Eq. (10) using propagated f of temporary placing as an initial value.

That is, the generation unit 12 substitutes a random value for the initial value of the complex amplitude information g and generates the auxiliary plane a according to the G-S method. The generation unit 12 substitutes the generated auxiliary plane a into Eq. (11), and generates f of temporary placing using the TwIST method. The generation unit 12 substitutes generated f of temporary placing into Eq. (10) and generates g of temporary placing having higher accuracy than the random value.

The generation unit 12 iterates the above-described process until the information indicating the intensity of the scattered light SL reconstructed from g of temporary placing approximates to the captured image obtained by imaging the imaging object OB in the imaging unit 11.

Also, a method of solving Eq. (1) and Eq. (2) is not limited to a method according to the alternating projection of the G-S method and the TwIST method described above.

[Example of Information Indicating Phase and Amplitude of Scattered Light from Imaging Object Generated by Electromagnetic Wave Phase/Amplitude Generation Device]

Next, an example of the complex amplitude information g generated by the electromagnetic wave phase/amplitude generation device 100 will be described with reference to FIGS. 4 to 6.

Figure 4:
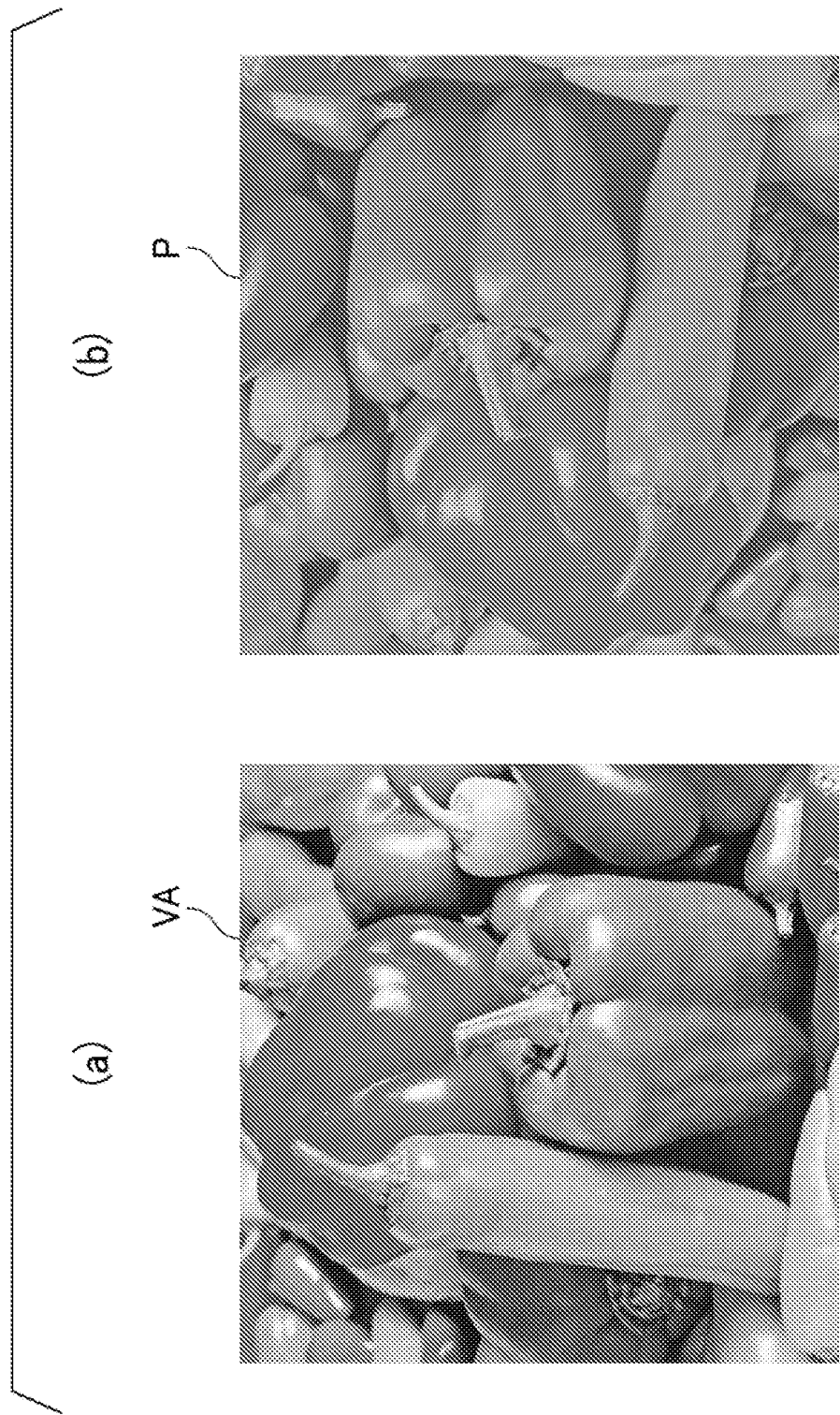
FIG. 4 is a diagram showing an example of information indicating amplitude of scattered light and information indicating a phase of scattered light.

FIG. 4 is a diagram showing an example of information VA indicating the amplitude of the scattered light SL and information P indicating the phase of the scattered light SL.

FIG. 4(*a*) is an example of the information VA indicating the amplitude of the scattered light SL.

FIG. 4(*b*) is an example of the information P indicating the phase of the scattered light SL. In this example, for experimentation, the information P indicating the phase is a phase obtained by rotating the original phase by 90 degrees.

Figure 5:
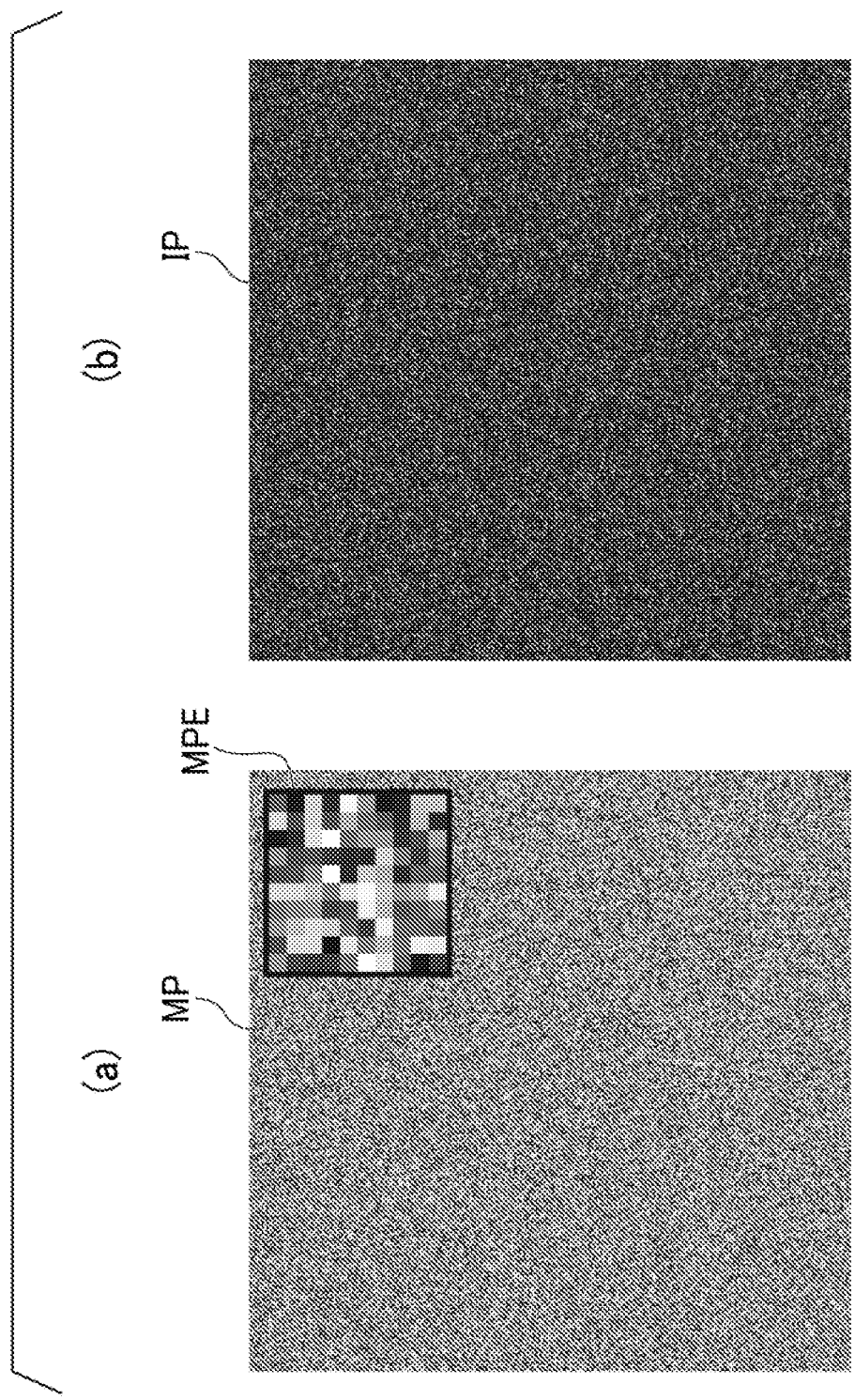
FIG. 5 is a diagram showing an example of a scattering plate and a captured image.

Next, FIG. 5 is a diagram showing an example of the scattering plate MP and the captured image IP.

FIG. 5(*a*) is an example of the scattering plate MP and a scattering plate MPE obtained by enlarging a part of the scattering plate MP. The scattering plate MP has a random pattern on a spatial frequency. That is, when the pattern of the scattering plate MP is subjected to a Fourier transform, a pattern in which a peak on the spatial frequency is not periodically generated is given.

FIG. 5(*b*) is an example of the captured image IP obtained by the imaging unit 11 imaging the scattered light SL scattered by the imaging object OB.

Figure 6:
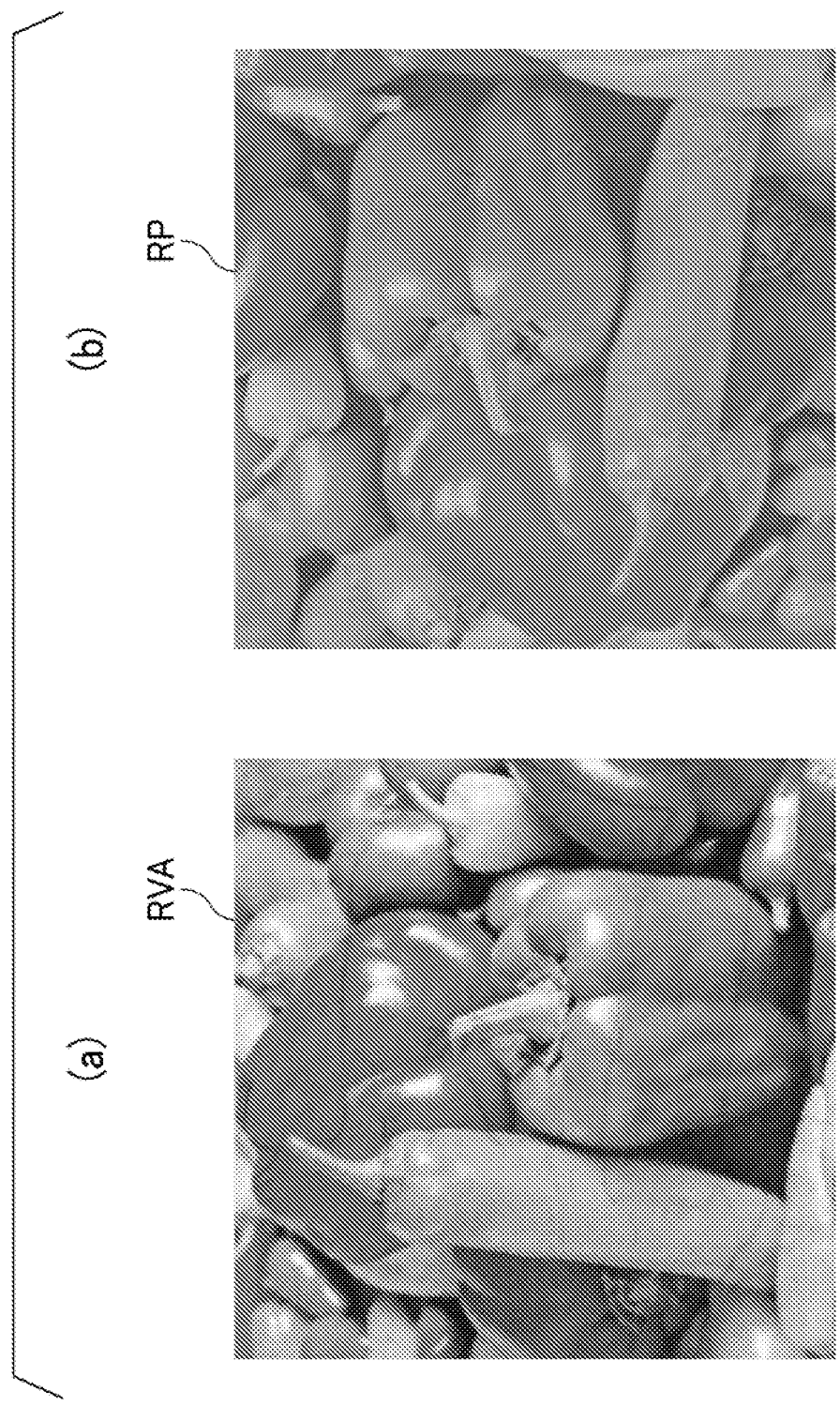
FIG. 6 is a diagram showing an example of information generated by a generation unit from complex amplitude information.

Next, FIG. 6 is a diagram showing an example of information generated from information g indicating the phase and the amplitude generated by the generation unit 12.

FIG. 6(*a*) is a diagram showing an example of an intensity RVA generated from the information indicating the amplitude generated by the generation unit 12. When FIG. 6(*a*) is compared with FIG. 4(*a*), it can be seen that the generation unit 12 generates amplitude information approximating to the information VA indicating the amplitude of the scattered light SL.

FIG. 6(*b*) is a diagram showing an example of information RP indicating the phase generated by the generation unit 12. When FIG. 6(*b*) is compared with FIG. 4(*b*), it can be seen that the generation unit 12 phase information approximating to the information P indicating the phase of the scattered light SL.

[Conclusion]

As described above, the electromagnetic wave phase/amplitude generation device 100 includes the radiation unit RL, the imaging unit 11, and the generation unit 12. The imaging unit 11 captures the scattered light SL generated when the imaging object OB scatters the radiated light REW radiated from the radiation unit RL. The generation unit 12 generates the complex amplitude information g by performing an arithmetic sparsity constraint operation according to sparsity of the imaging object OB according to the captured image IP captured by the imaging unit 11, the pattern information RPI, and the information f indicating the signal of the imaging object OB. The electromagnetic wave phase/amplitude generation device 100 can directly detect the scattered light SL using the imaging element and can increase the signal-to-noise ratio. Also, because the electromagnetic wave phase/amplitude generation device 100 can directly detect the scattered light SL using the imaging element, it is possible to suppress an intensity of light emitted from the radiation unit RL as compared with a case in which the scattered light SL is not directly detected by the imaging element. That is, the electromagnetic wave phase/amplitude generation device 100 can reduce the invasiveness to the imaging object.

Because the electromagnetic wave phase/amplitude generation device 100 can generate the complex amplitude information g, it is possible to obtain distribution information of a thickness of the imaging object OB and a refractive index of the electromagnetic waves. Because the electromagnetic wave phase/amplitude generation device 100 can obtain the distribution information of the thickness of the imaging object OB and the refractive index of the electromagnetic waves, it is possible to calculate quantitative information from the complex amplitude information g.

Because the electromagnetic wave phase/amplitude generation device 100 can generate the complex amplitude information g on the basis of the captured image IP obtained in one imaging process and the pattern information RPI indicating the random radiation pattern, it is possible to generate the complex amplitude information g without damaging the imaging object OB vulnerable to electromagnetic waves. Also, because the electromagnetic wave phase/amplitude generation device 100 can generate the complex amplitude information g on the basis of the captured image IP obtained in one imaging process and the pattern information RPI indicating the random radiation pattern, it is possible to generate the complex amplitude information g even when the imaging object OB moves.

The generation unit 12 iteratively generates the information g indicating at least the phase and the amplitude of the electromagnetic waves on the basis of the generated information g indicating at least the phase and the amplitude of the electromagnetic waves and the information indicating the signal of the imaging object OB. By iterating the generation of the complex amplitude information g, the generation unit 12 can make a nonlinear problem a linear problem and can generate the information g indicating at least the phase and the amplitude of the electromagnetic waves.

When the random pattern in which the radiation unit RL radiates light described above is a pattern in which a spectrum uniformly spreads on the spatial frequency, the electromagnetic wave phase/amplitude generation device 100 can satisfactorily generate complex amplitude information g of the scattered light SL in all surfaces to which the radiated light REW is radiated from the radiation unit RL.

Also, the electromagnetic waves include at least one selected from the group consisting of visible rays, X rays, electron rays, ultraviolet rays, infrared rays, terahertz waves, millimeter waves, and microwaves. Because the electromagnetic wave phase/amplitude generation device 100 does not require a lens, it is possible to generate information indicating the phase and amplitude of electromagnetic waves such as X rays, electron rays, ultraviolet rays, infrared rays, and terahertz waves for which it is difficult to make a lens in the past. Also, because the electromagnetic wave phase/amplitude generation device 100 does not require a lens, it is possible to reduce a size of a casing of the electromagnetic wave phase/amplitude generation device 100.

When there are a plurality of types of scattering plates MP for each imaging object OB as described above, pattern information RPI is stored in the storage unit 16 for each type of scattering plate MP. In this case, the generation unit 12 selects the pattern information RPI to be read by an operation from the user detected by the operation detection unit 14.

Although a case in which the generation unit 12 performs the arithmetic sparsity constraint operation to generate the complex amplitude information g has been described above, the complex amplitude information g may be calculated by another device. The other device is a device for a web service or the like to be operated by a server on the network. In this case, the generation unit 12 outputs the information necessary for generating the complex amplitude information g to the other device. The generation unit 12 may acquire the complex amplitude information g generated by the other device.

Second Embodiment

An example of a configuration of an electromagnetic wave phase/amplitude generation device 100-1 according to the present embodiment will be described with reference to FIG. 7.

Figure 7:
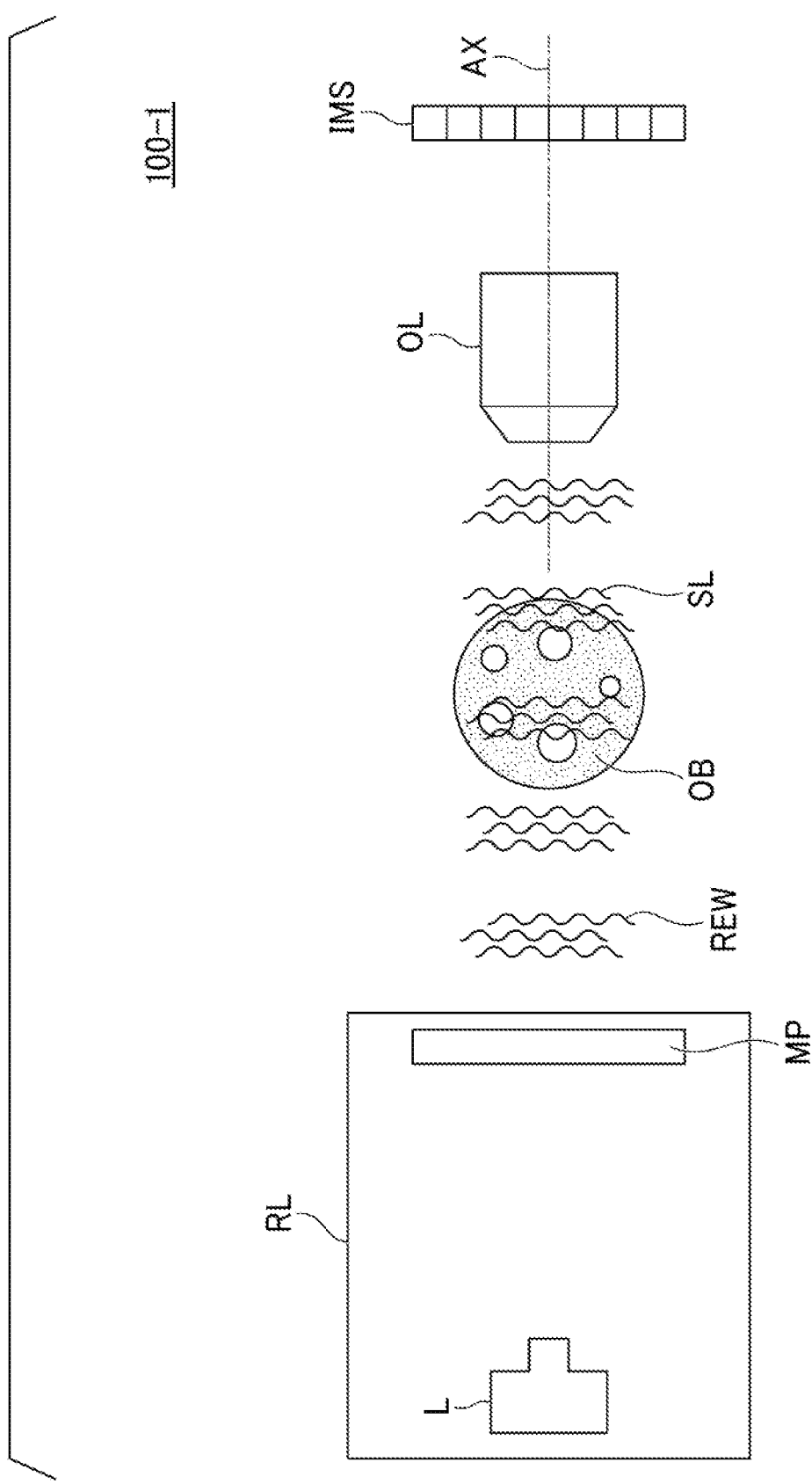
FIG. 7 is a diagram showing an example of a configuration of the electromagnetic wave phase/amplitude generation device.

FIG. 7 is a diagram showing the example of the configuration of the electromagnetic wave phase/amplitude generation device 100-1. The electromagnetic wave phase/amplitude generation device 100-1 according to the present embodiment is different from the above-described electromagnetic wave phase/amplitude generation device 100 in that an imaging object OB can be three-dimensionally imaged. Also, the same reference signs are given to components similar to those of the first embodiment and description thereof will be omitted.

The electromagnetic wave phase/amplitude generation device 100-1 generates information indicating a phase and the amplitude of scattered light SL by performing an arithmetic sparsity constraint operation according to the sparsity of the imaging object OB on the basis of states of wavefronts of the scattered light SL at a plurality of distances. Here, the wavefronts of the scattered light SL at the plurality of distances refer to a plurality of wavefronts separated from each other in a traveling direction of the scattered light SL among wavefronts of the scattered light SL. As one example, the wavefronts of the scattered light SL at the plurality of distances are wavefronts having distances different from each other from the imaging unit 11 at a certain moment.

Specifically, a storage unit 16 stores pattern information RPI. The pattern information RPI of the present embodiment includes distance-specific wavefront pattern information indicating the states of the wavefronts of the scattered light SL at the plurality of distances. In other words, the storage unit 16 stores the pattern information RPI including the distance-specific wavefront pattern information.

A generation unit 12 generates the information indicating the phase and the amplitude of the scattered light SL by performing an arithmetic sparsity constraint operation according to the sparsity of the imaging object OB on the basis of the captured image IP acquired from the imaging unit 11 and the pattern information RPI acquired from the storage unit 16. Here, the generation unit 12 of the present embodiment performs an arithmetic sparsity constraint operation according to the sparsity of the imaging object OB for each wavefront of the scattered light SL on the basis of distance-specific wavefront pattern information included in the pattern information RPI.

Here, information about each tomographic plane of the imaging object OB is included in each wavefront of the scattered light SL imaged by the imaging unit 11. The generation unit 12 generates information indicating a phase and amplitude of each tomographic plane of the imaging object OB by performing an arithmetic sparsity constraint operation on each wavefront of the scattered light SL.

The electromagnetic wave phase/amplitude generation device 100-1 can generate the information indicating the phase and amplitude of each tomographic plane of the imaging object OB generated by the generation unit 12, i.e., information indicating a three-dimensional structure of the imaging object OB.

Figure 8:
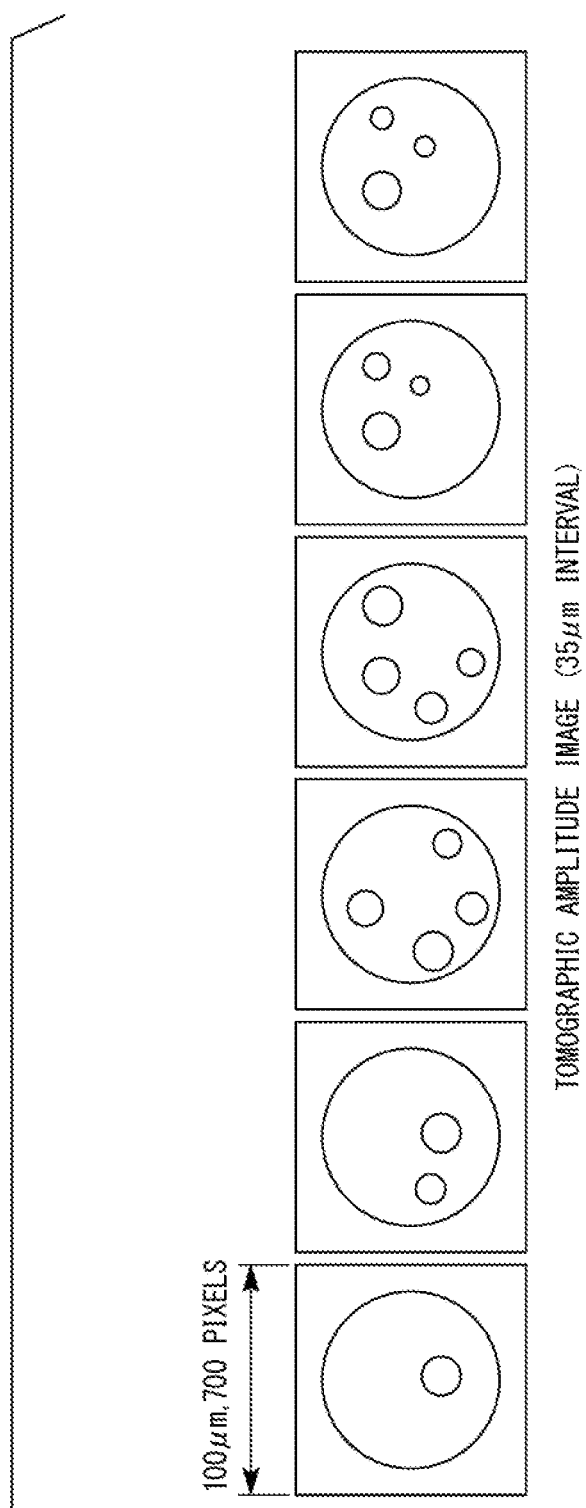
FIG. 8 is an example of a tomographic amplitude image of an imaging object generated by the generation unit.
Figure 9:
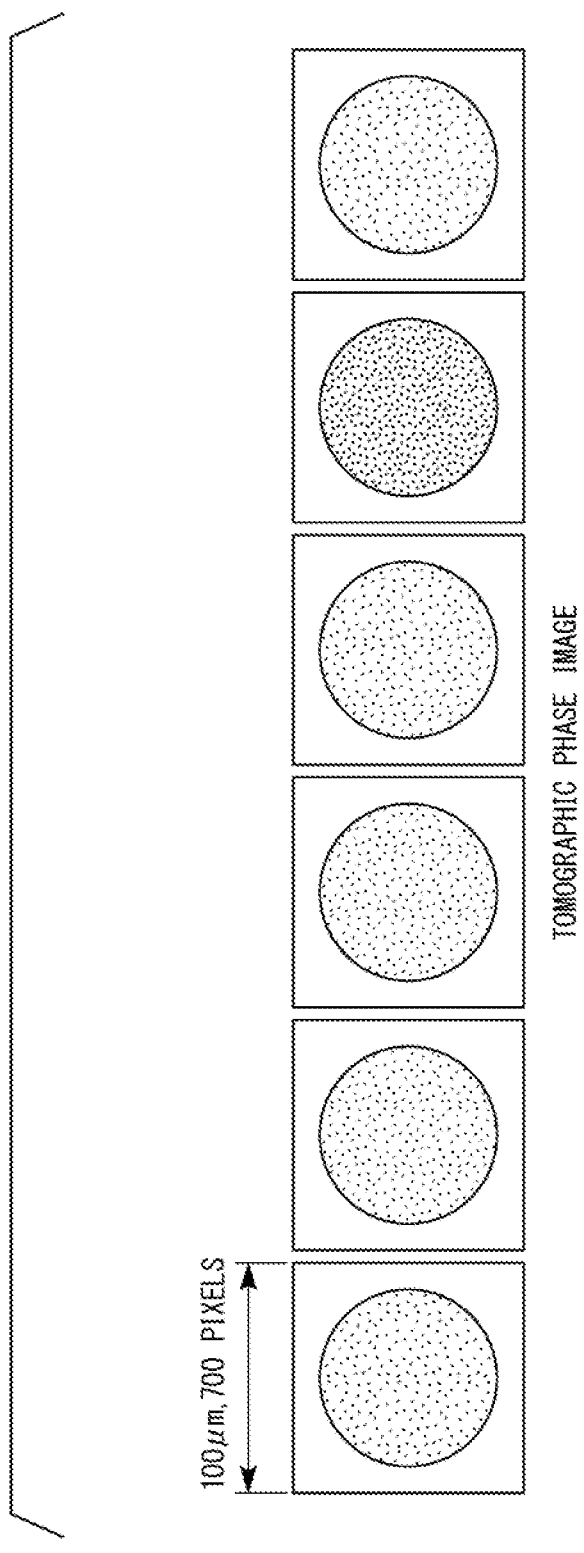
FIG. 9 is an example of a tomographic phase image of an imaging object generated by the generation unit.

Examples of a result of generating the information indicating the phase and the amplitude of each tomographic plane of the imaging object OB in the electromagnetic wave phase/amplitude generation device 100-1 are shown in FIGS. 8 and 9.

FIG. 8 is an example of a tomographic amplitude image of the imaging object OB generated by the generation unit 12.

FIG. 9 is an example of a tomographic phase image of the imaging object OB generated by the generation unit 12.

FIGS. 8 and 9 show an example of a case when the imaging object OB is Volvox. As shown in FIGS. 8 and 9, according to the electromagnetic wave phase/amplitude generation device 100-1, it is possible to generate a tomographic image in which a position of the imaging unit 11 in an optical axis AX direction is variously changed. Also, according to the electromagnetic wave phase/amplitude generation device 100-1, it is possible to obtain an image indicating the three-dimensional structure of the imaging object OB by reconstructing the tomographic image.

Third Embodiment

An example of a configuration of an electromagnetic wave phase/amplitude generation device 100-2 according to the present embodiment will be described with reference to FIGS. 10 to 23. The electromagnetic wave phase/amplitude generation device 100-2 according to the present embodiment is different from the electromagnetic wave phase/amplitude generation device 100 and the electromagnetic wave phase/amplitude generation device 100-1 in that it is possible to obtain information indicating a phase and amplitude of high resolution even when the resolution of an imaging unit 11 is relatively low. Also, the same reference signs are given to components similar to those in each of the above-described embodiments and the description thereof will be omitted.

Figure 10:
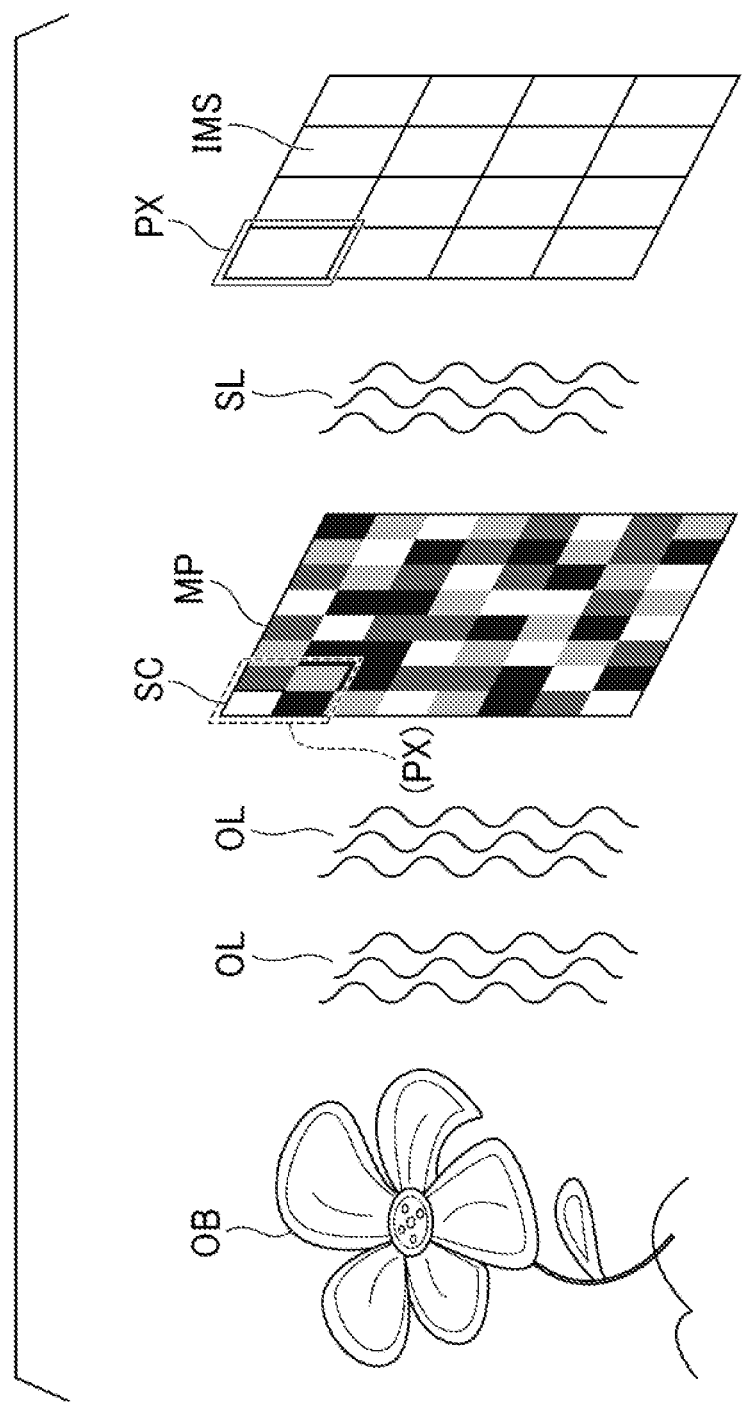
FIG. 10 is a diagram showing an example of a configuration of the electromagnetic wave phase/amplitude generation device.

FIG. 10 is a diagram showing an example of the configuration of the electromagnetic wave phase/amplitude generation device 100-2.

Figure 11:
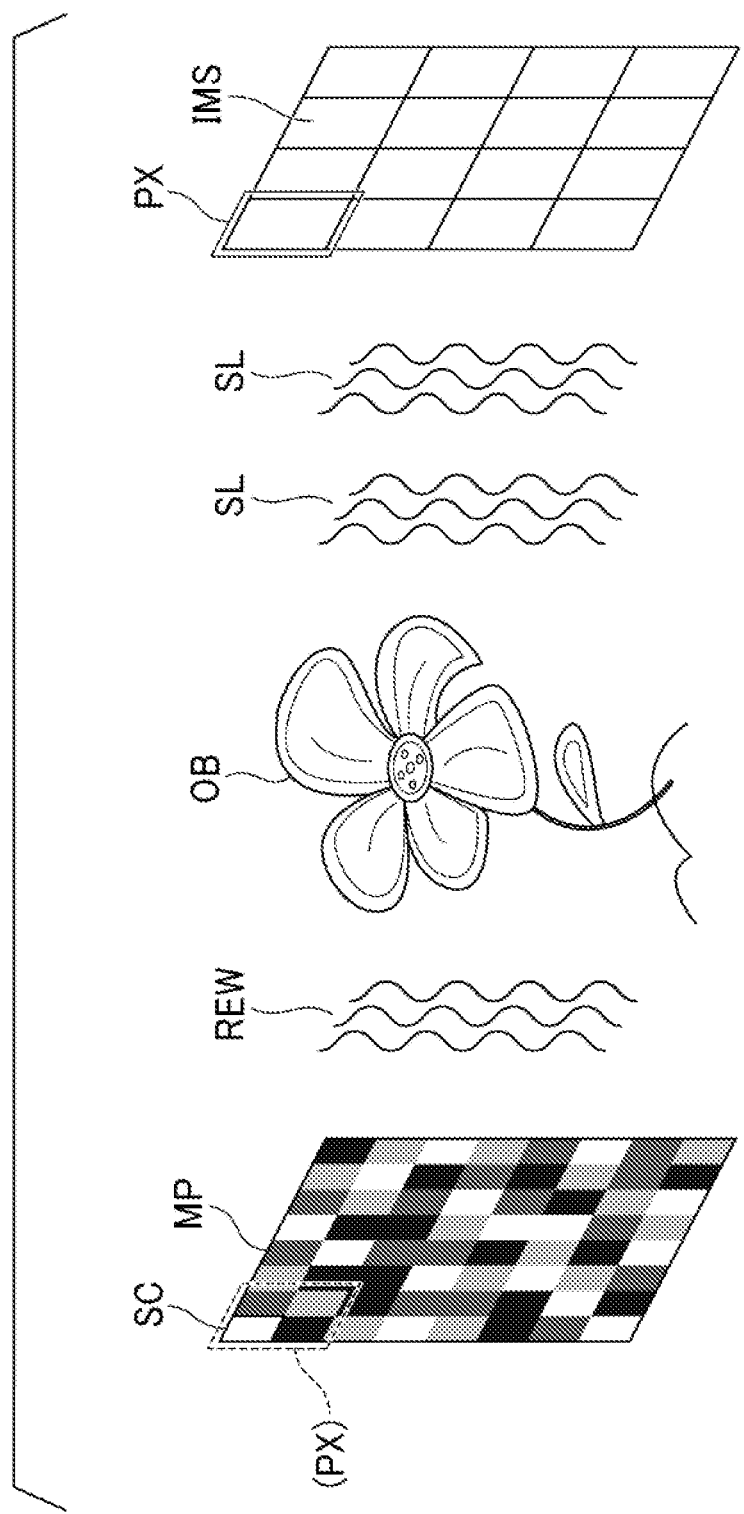
FIG. 11 is a diagram showing another example of a configuration of the electromagnetic wave phase/amplitude generation device.

FIG. 11 is a diagram showing another example of the configuration of the electromagnetic wave phase/amplitude generation device 100-2.

In the example of the present embodiment, if the resolution of the imaging unit 11 is lower than the resolution of an arithmetic sparsity constraint operation of a generation unit 12, this means that the number of pixels of an imaging element of the imaging unit 11 is relatively small. For example, if the resolution of the imaging unit 11 is low, this means that the number of pixels of the imaging element of the imaging unit 11 is smaller than the number of pixels for which a spatial frequency of a pattern of a scattering plate MP can be resolved. Here, if each of regions on the scattering plate MP having different scattering rates is referred to as a "scattering section SC of the scattering plate MP", the low resolution of the imaging unit 11 means that the number of pixels of the imaging element of the imaging unit 11 is smaller than the number of scattering sections of the scattering plate MP.

Also, if the "number of pixels of the imaging element of the imaging unit 11 is smaller than the number of scattering sections of the scattering plate MP", this means that a magnitude of a matrix of $|g|^2$ (i.e., a captured image IP) included in Eq. (1) and Eq. (2) is smaller than a magnitude of a matrix of M (i.e., pattern information RPI of the scattering plate MP) included in the same equation.

FIG. 10 shows an example of a configuration of coded aperture type diffraction imaging. In the configuration of this example, object light OL emitted from an imaging object OB is incident on the scattering plate MP. The scattered light SL according to the object light OL is emitted from the scattering plate MP and the emitted scattered light SL is incident on the imaging unit 11. That is, in the case of the configuration of the present example, the scattering plate MP is disposed between the imaging object OB and the imaging unit 11.

In FIG. 10, a case in which a ratio of the number of pixels PX of the imaging element of the imaging unit 11 to the number of scattering sections SC of the scattering plate MP is 1:4 is shown. In other words, in the example shown in FIG. 10, the number of pixels PX of the imaging element of the imaging unit 11 is smaller than the number of scattering sections SC of the scattering plate MP.

In FIG. 11, an example of a configuration of coded illumination type diffraction imaging is shown. In the configuration of the present example, radiated light REW is emitted from the scattering plate MP and the emitted radiated light REW is radiated to the imaging object OB. When the radiated light REW is radiated to the imaging object OB, the scattered light SL corresponding to the radiated light REW is emitted from the imaging object OB and the emitted scattered light SL is incident on the imaging unit 11. That is, in the case of the configuration of the present example, the imaging object OB is disposed between the scattering plate MP and the imaging unit 11.

In the case of the example of FIG. 11, as in the example shown in FIG. 10, a ratio between the number of pixels PX of the imaging element of the imaging unit 11 and the number of scattering sections SC of the scattering plate MP is 1:4. That is, also in the example of FIG. 11, the number of pixels PX of the imaging element of the imaging unit 11 is smaller than the number of scattering sections SC of the scattering plate MP.

Also, the ratio between the number of pixels PX of the imaging element of the imaging unit 11 and the number of scattering sections SC of the scattering plate MP may be made variable by so-called binning Here, the binning is to perform an imaging operation by grouping several pixels PX among the pixels PX of the imaging element and designating the grouped pixels PX as one pixel. As an example, if 2×2 binning is performed on the pixels PX of the imaging element of the imaging unit 11, the number of pixels after binning becomes ¼ of that before binning. For example, if 2×2 binning is performed when the number of pixels PX of the imaging element of the imaging unit 11 is the same as the number of scattering sections SC of the scattering plate MP, the ratio between the number of pixels PX after binning of the imaging element and the number of scattering sections SC of the scattering plate MP becomes 1:4. The imaging unit 11 of the present embodiment may be configured so that binning according to a type or magnitude of the imaging object OB or according to desired resolution or processing speed is possible.

Hereinafter, the case of the coded illumination type diffraction imaging shown in FIG. 11 between the configuration examples shown in FIGS. 10 and 11 will be described as an example.

As described in the first embodiment, the generation unit 12 generates information indicating the phase and the amplitude of the scattered light SL by performing the arithmetic sparsity constraint operation according to arithmetic operations shown in Eq. (1) and Eq. (2), i.e., on the basis of the pattern information RPI of the scattering plate MP.

In the present embodiment, the number of pixels of the imaging element of the imaging unit 11 is smaller than the number of scattering sections of the scattering plate MP. In this case, a magnitude of the matrix of $|g|^2$ included in Eq. (1) and Eq. (2) is not the same as a magnitude of the matrix of M included in in Eq. (1) and Eq. (2). Also, the magnitude of the matrix used herein is, for example, the number of rows and the number of columns of the matrix. In this manner, when the magnitude of the matrix of $|g|^2$ included in Eq. (1) and Eq. (2) is not the same as the magnitude of the matrix of M included in in Eq. (1) and Eq. (2), an arithmetic operation of generating the phase and amplitude of the scattered light SL is performed on the basis of a correspondence relationship between the two matrices. When the magnitudes of these two matrices are not the same, for example, the arithmetic operation of generating the phase and the amplitude of the scattered light SL is performed by making the magnitudes of the two matrices the same.

In this manner, when the magnitudes of the two matrices are not the same, for example, a procedure of making the magnitudes of the two matrices the same includes the following two procedures.

(Procedure 1: conventional procedure) The phase and the amplitude of the scattered light SL are generated by interpolating (for example, linearly interpolating) the captured image IP captured by the imaging unit 11.

(Procedure 2: procedure of present embodiment) The phase and the amplitude of the scattered light SL are generated without interpolating the captured image IP captured by the imaging unit 11.

The generation unit 12 of the present embodiment adopts (Procedure 2).

In the case of (Procedure 1), the magnitudes of the two matrices are the same by expanding the magnitude of the matrix while interpolating elements of the matrix of $|g|^2$ (for example, linear interpolation). In this case (Procedure 1), information that is not included in the captured image IP captured by the imaging unit 11 is generated by interpolation.

On the other hand, in the case of the above-described (Procedure 2), the generation unit 12 of the present embodiment performs the arithmetic operation without interpolating the element of $|g|^2$ included in Eq. (1) and Eq. (2). Specifically, in the storage unit 16 of the present embodiment, a correspondence relationship between the elements of the matrix of $|g|^2$ (i.e., the pixels of the imaging unit 11) and the elements of the matrix of M (i.e., pixels of the scattering plate MP) is stored. The generation unit 12 generates the phase and the amplitude of the scattered light SL by associating pixel values of the captured image IP with the elements of the matrix of M on the basis of the correspondence relationship stored in the storage unit 16. The correspondence relationship between the elements of the matrix of $|g|^2$ and the elements of the matrix of M is an example of the correspondence relationship between the resolution of the imaging unit 11 and the resolution of the arithmetic sparsity constraint operation of the generation unit 12.

In the case of (Procedure 2), i.e., according to the generation unit 12 of the present embodiment, because interpolation is not performed on the captured image IP, information that is not included in the captured image IP captured by the imaging unit 11 is not generated.

[Examples of Experiment Results]

Examples of experiment results for generating an amplitude image and a phase image in the electromagnetic wave phase/amplitude generation device 100-2 according to the present embodiment will be described with reference to FIGS. 12 to 23. First, an example of an experiment result for an amplitude image will be described with reference to FIGS. 12 to 17. Next, an example of an experiment result for a phase image will be described with reference to FIGS. 18 to 23.

[Example of Experiment Result for Amplitude Image]

Figure 12:
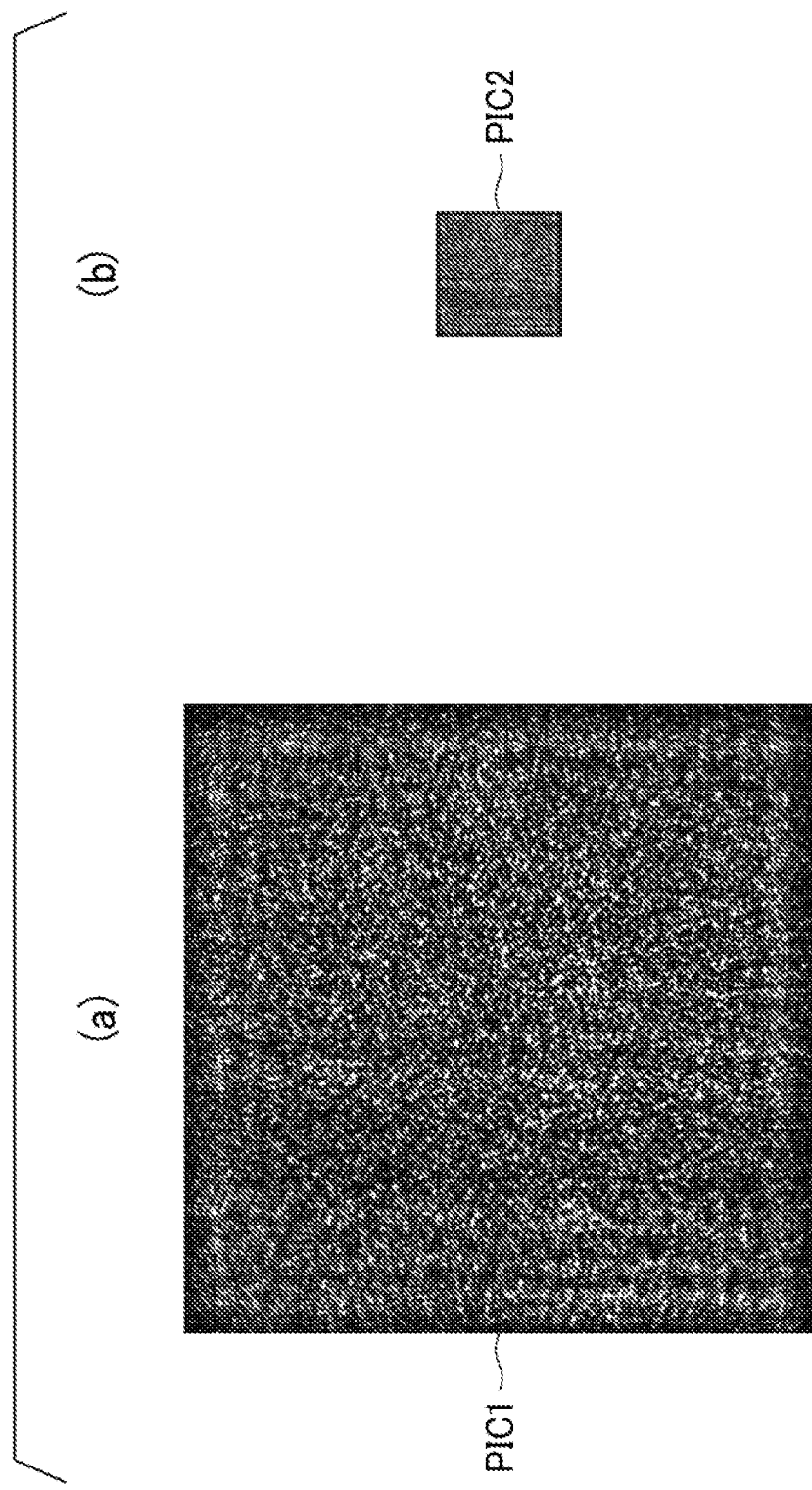
FIG. 12 is a diagram showing an example of a comparison of the number of pixels of captured images.

FIG. 12 is a diagram showing an example of a comparison of the number of pixels of captured images IP. FIG. 12(A) shows an example of a captured image IP (an image PIC1) from the imaging unit 11 when the number of pixels of the imaging element of the imaging unit 11 is the same as the number of scattering sections of the scattering plate MP.

FIG. 12(B) shows an example of a captured image IP (an image PIC2) from the imaging unit 11 when the number of pixels of the imaging element of the imaging unit 11 is smaller than the number of scattering sections of the scattering plate MP. Here, the imaging object OB is a wire (a thin metal wire). In this example, a position of the wire which is the imaging object OB periodically moves. Therefore, in this example, the positions of the wire imaged in the captured image IP are different from each other according to an imaging timing.

As shown in this example, the distance between the pixels of the captured image IP when the number of pixels of the imaging element is smaller than the number of scattering sections of the scattering plate MP (FIG. 12(B)) is larger than that when the number of pixels of the imaging element is the same as the number of scattering sections of the scattering plate MP (FIG. 12(A)). That is, when the number of pixels of the imaging element is smaller than the number of scattering sections of the scattering plate MP, the resolution of the captured image IP is low.

Figure 13:
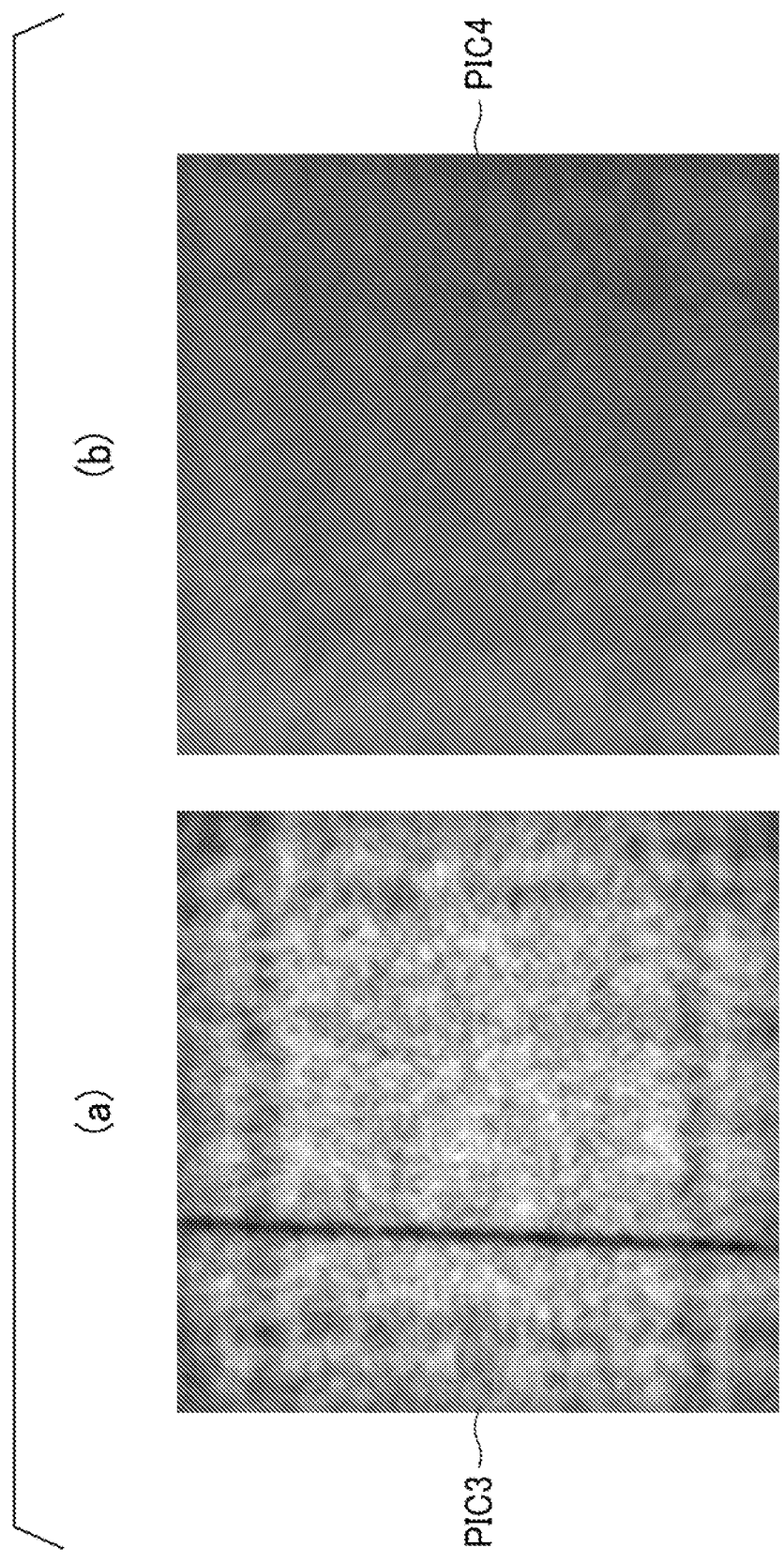
FIG. 13 is a diagram showing an example of an amplitude image and a phase image of scattered light when the number of pixels of the imaging element is the same as the number of scattering sections of the scattering plate.

FIG. 13 is a diagram showing an example of an amplitude image and a phase image of the scattered light SL when the number of pixels of the imaging element is the same as the number of scattering sections of the scattering plate MP. FIG. 13(A) is an example of an amplitude image (an image PIC3) of the scattered light SL when the number of pixels of the imaging element is the same as the number of scattering sections of the scattering plate MP. FIG. 13(B) is an example of a phase image (an image PIC4) of the scattered light SL when the number of pixels of the imaging element is the same as the number of scattering sections of the scattering plate MP. FIG. 13(B) shows the amplitude image and the phase image of the scattered light SL when the number of pixels of the imaging element of the imaging unit 11 is relatively large, i.e., when the resolution is high.

Figure 14:
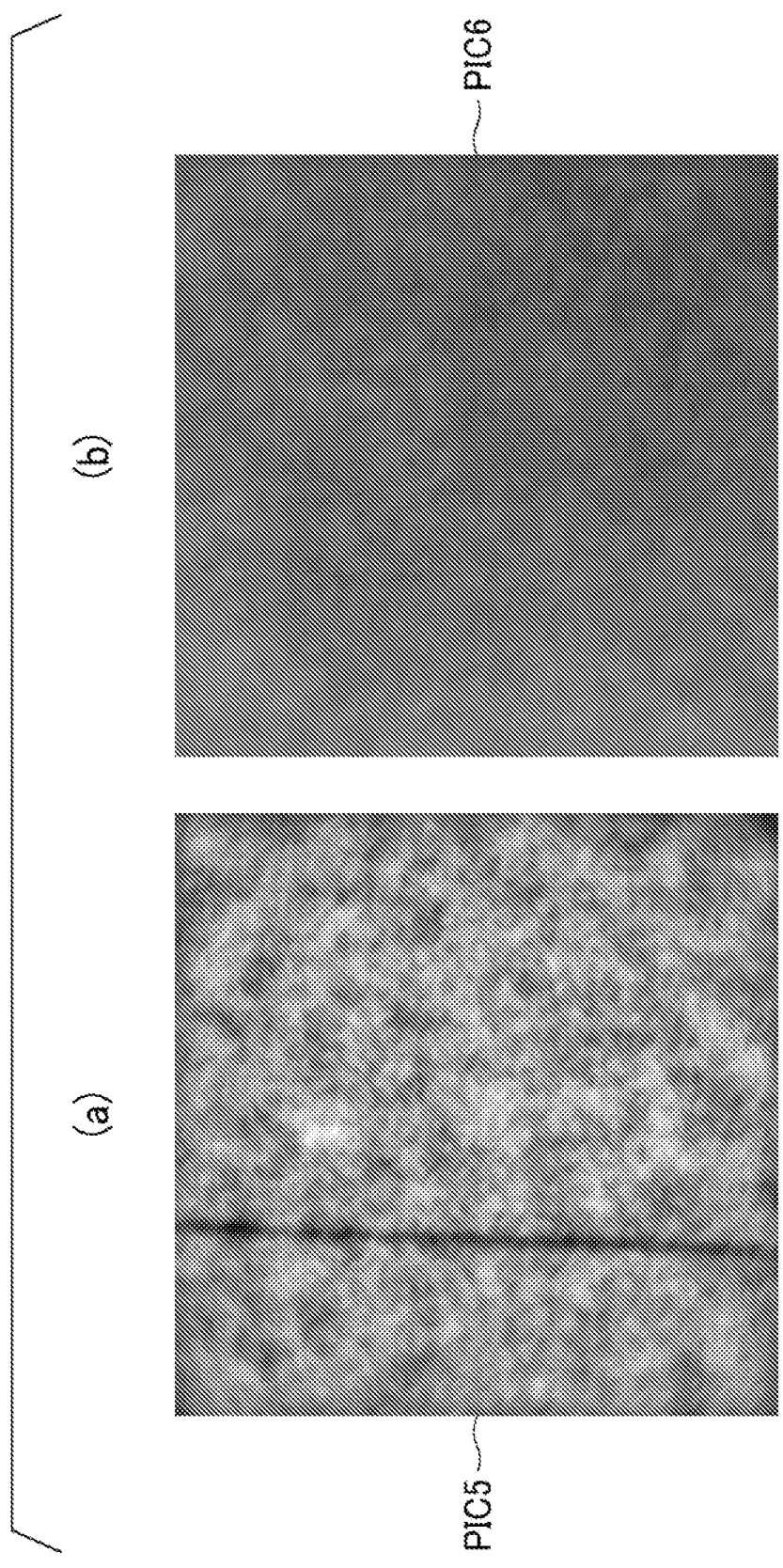
FIG. 14 is a diagram showing an example of an amplitude image and a phase image of scattered light from the generation unit when the number of pixels of the imaging element is smaller than the number of scattering sections of the scattering plate.

FIG. 14 is a diagram showing an example of an amplitude image and a phase image of the scattered light SL from the generation unit 12 when the number of pixels of the imaging element is smaller than the number of scattering sections of the scattering plate MP. That is, FIG. 14 shows the amplitude image (an image PIC5) and the phase image (an image PIC6) of the scattered light SL when the number of pixels of the imaging element of the imaging unit 11 is relatively small, i.e., when the resolution is low. The generation unit 12 generates an amplitude image and a phase image of the scattered light SL according to the above-described (Procedure 2). More specifically, the generation unit 12 generates the phase and the amplitude of the scattered light SL by associating the pixel value of the captured image IP with each element of the matrix of M on the basis of a correspondence relationship between each element of the matrix of $|g|^2$ included in Eq. (1) and Eq. (2) (i.e., the pixel of the imaging unit 11) and each element of the matrix of M (i.e., the scattering section SC of the scattering plate MP). That is, the generation unit 12 does not interpolate the element of $|g|^2$. FIG. 14(A) is an example of an amplitude image of the scattered light SL when the element of $|g|^2$ is not interpolated. FIG. 14(B) is an example of a phase image of the scattered light SL when the element of $|g|^2$ is not interpolated.

Even when the resolution of the imaging unit 11 is relatively low (in the case shown in FIG. 14), the amplitude image and the phase image having resolutions equivalent to those when the resolution of the imaging unit 11 is relatively high (in the case shown in FIG. 13) are obtained.

Figure 15:
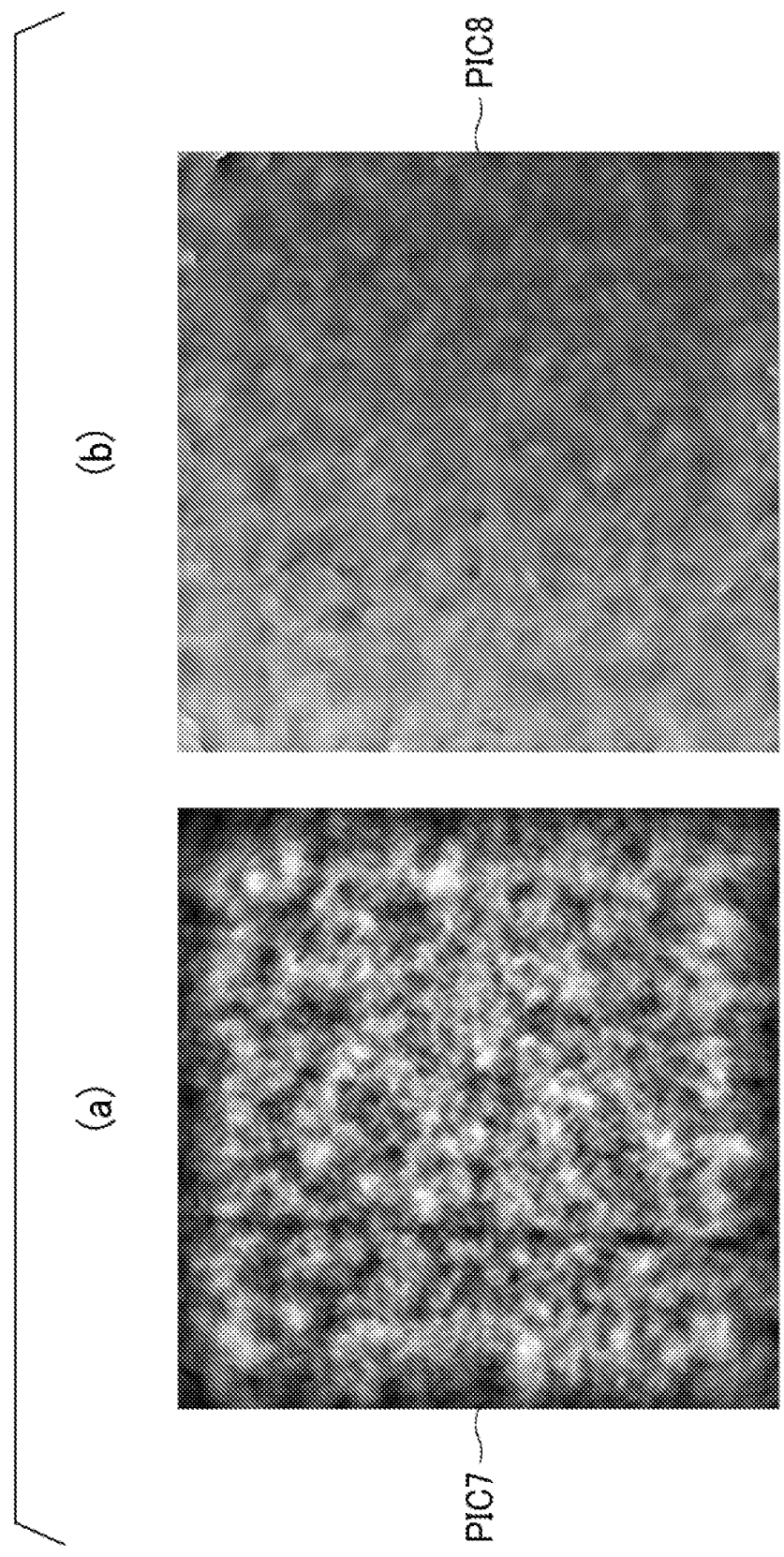
FIG. 15 is a diagram showing an example of an amplitude image and a phase image of scattered light according to a conventional technique.

Here, an example of a result of an arithmetic operation according to the above-described (Procedure 1), i.e., the conventional technique, as an object to be compared is shown in FIG. 15.

FIG. 15 is a diagram showing an example of an amplitude image (an image PICT) and a phase image (an image PIC8) of the scattered light SL according to the conventional technique. According to the conventional technique, both the amplitude image and the phase image have lower resolutions than those in the case of the generation unit 12 of the present embodiment (the case of FIG. 14).

In the case of the present embodiment, the number of pixels of the imaging element of the imaging unit 11 is smaller than the number of scattering sections of the scattering plate MP. That is, in the case of the present embodiment, the resolution of the imaging unit 11 is low with respect to the spatial frequency of the scattering plate MP. Thus, if the generation unit 12 generates an amplitude image or a phase image using the captured image IP captured by the imaging unit 11 for only one frame, the resolution of the generated image is lowered.

However, as described above, the generation unit 12 of the present embodiment iteratively generates the amplitude image and the phase image using captured images IP of a plurality of frames. In the captured images IP of the plurality of frames, the imaging object OB is imaged. The imaging object OB imaged in the plurality of captured images IP differs according to each frame. That is, the plurality of captured images IP include different information of the imaging object OB.

The generation unit 12 can acquire more information than the information obtained from the captured image IP of one frame with respect to the imaging object OB by iteratively acquiring the information of the imaging object OB included in the captured image IP for each frame. Thereby, the generation unit 12 can generate an amplitude image and a phase image with resolutions exceeding the resolution of the imaging unit 11.

Here, in general, the imaging element outputs a signal indicating a pixel value of the captured image for each pixel. If an output time of the signal indicating the pixel value is constant for each pixel, an output time of signals from all pixels of the imaging element when the number of pixels of the imaging element is small is shorter than that when the number of pixels is large. That is, a speed of an imaging operation when the number of pixels is small can be made higher than that when the number of pixels is large.

Figure 16:
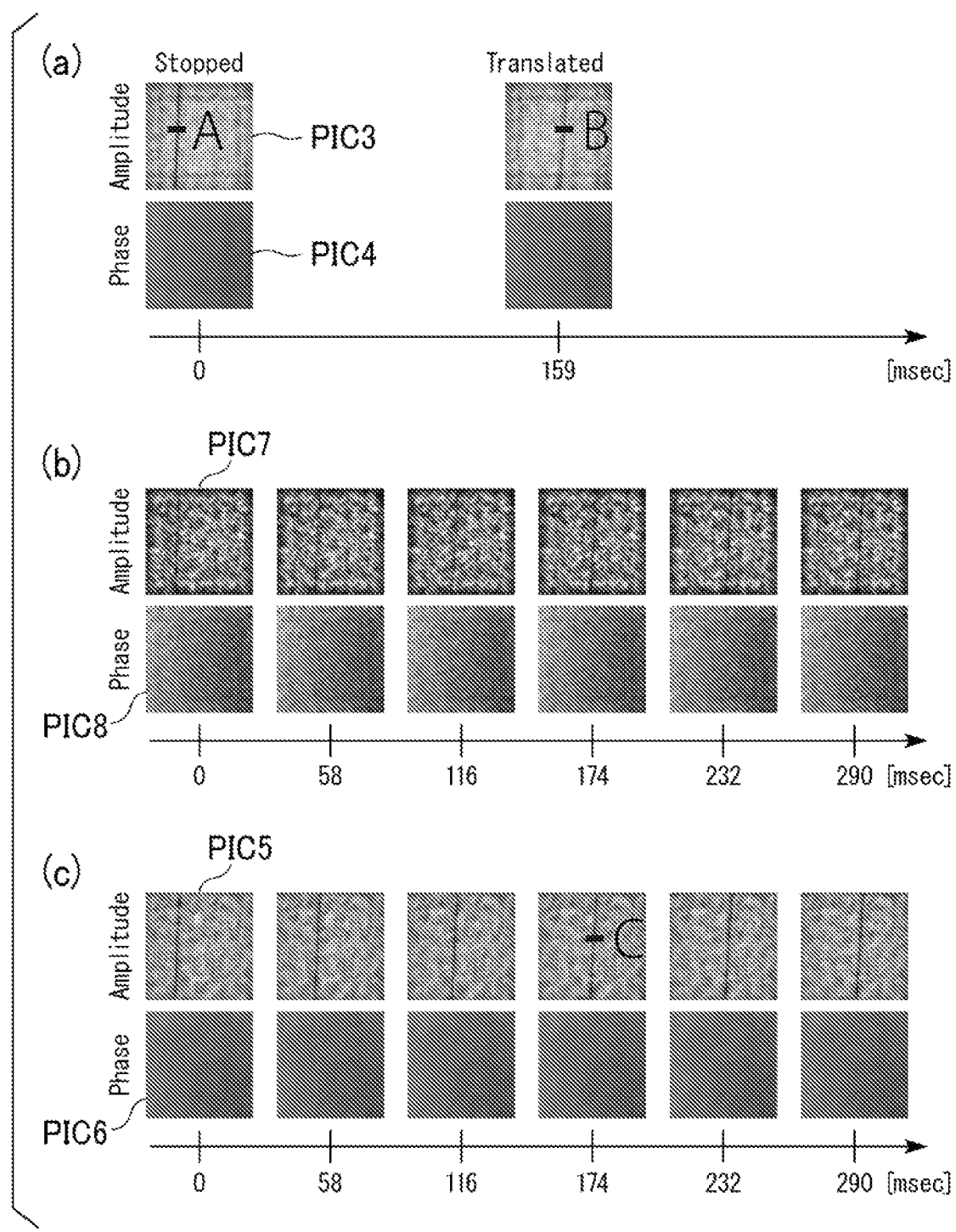
FIG. 16 is a diagram showing an example of an amplitude image and a phase image generated in time series.

FIG. 16 is a diagram showing an example of an amplitude image and a phase image generated in time series. FIG. 16(A) shows an example of an amplitude image and a phase image generated in the condition shown in FIG. 12(A), i.e., when the number of pixels of the imaging element of the imaging unit 11 is the same as the number of scattering sections of the scattering plate MP. FIG. 16(B) and FIG. 16(C) show an example of an amplitude image and a phase image generated in the condition shown in FIG. 12(B), i.e., when the number of pixels of the imaging element of the imaging unit 11 is smaller than the number of scattering sections of the scattering plate MP. Here, FIG. 16(B) shows an example of an amplitude image and a phase image generated according to the above-described (Procedure 1), i.e., the conventional procedure. FIG. 16(C) shows an example of an amplitude image and a phase image generated according to the above-described (Procedure 2), i.e., a procedure adopted by the generation unit 12 of the present embodiment.

As described above, the resolution of the imaging unit 11 of the present embodiment is lower than the resolution of the arithmetic sparsity constraint operation of the generation unit 12. That is, the number of pixels of the imaging unit 11 of the present embodiment is smaller than the number of scattering sections of the scattering plate MP. In other words, the number of pixels of the imaging element of the imaging unit 11 is smaller than that when the number of pixels of the imaging element is the same as the number of scattering sections of the scattering plate MP. The imaging unit 11 of the present embodiment has a higher imaging operation speed (FIG. 16(C)) than when the number of pixels of the imaging element is the same as the number of scattering sections of the scattering plate MP (FIG. 16(A)).

Also, the resolution of the imaging unit 11 of the present embodiment generates an amplitude image and a phase image according to the above-described (Procedure 2). On the other hand, according to (Procedure 1) that is the conventional technique, information that is not included in the captured image IP captured by the imaging unit 11 is generated by interpolation as described above. The information that is not included in the captured image IP corresponds to a noise component in an arithmetic operation according to Eq. (1) and Eq. (2) described above. Therefore, resolutions of the amplitude image and the phase image (FIG. 16(B)) generated according to (Procedure 1) that is the conventional technique are lower than those of the amplitude image and the phase image (FIG. 16(C)) generated according to (Procedure 2). That is, the generation unit 12 of the present embodiment can generate an amplitude image and a phase image having higher resolutions than those of the conventional technique.

Figure 17:
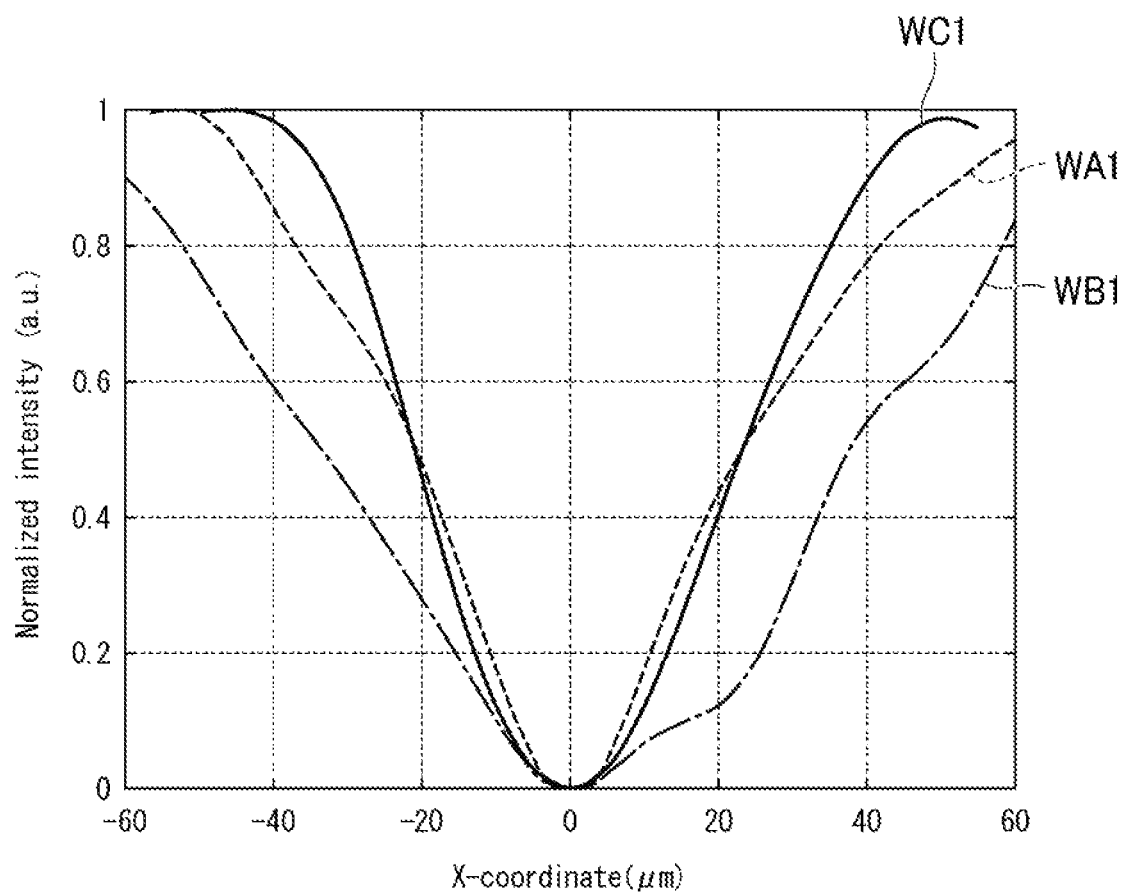
FIG. 17 is a diagram showing an example of a result of comparing resolutions of amplitude images.

FIG. 17 is a diagram showing an example of a result of comparing resolutions of amplitude images. In FIG. 17, a relationship between a coordinate of the imaging object OB indicated by the amplitude image and amplitude (intensity) is shown. Waveforms when the imaging element has higher resolution than the imaging element of the imaging unit 11 of the present embodiment are shown as waveforms W1A and W1B.

The waveform W1A thereof indicates the resolution of the amplitude image when the imaging object OB is stopped in FIG. 16(A). The waveform W1A is a reference example of the resolution of the amplitude image.

The waveform W1B shows the resolution of the amplitude image when the imaging object OB moves in FIG. 16(A). When the imaging element has resolution higher than that of the imaging element of the imaging unit 11 of the present embodiment, the imaging operation speed is slow, so that the image is blurred. This waveform W1B shows that the coordinate spread is greater than that of the above-described waveform W1A and that the resolution is lower than that of the reference example.

In the case of the resolution of the imaging unit 11 of the present embodiment, the waveform when the amplitude image is generated according to the above-described (Procedure 2), i.e., a technique adopted by the generation unit 12 of the present embodiment, (i.e., in the case of FIG. 16(C)) is shown as a waveform W1C. The waveform W1C indicates the resolution of the amplitude image when the imaging object OB moves in FIG. 16(C). This waveform W1C shows that the coordinate spread is less than that of the above-described waveform W1B, that the resolution is improved, and that the resolution equivalent to that of the reference example is obtained even when the imaging object OB moves.

[Example of Experiment Result for Phase Image]

Figure 18:
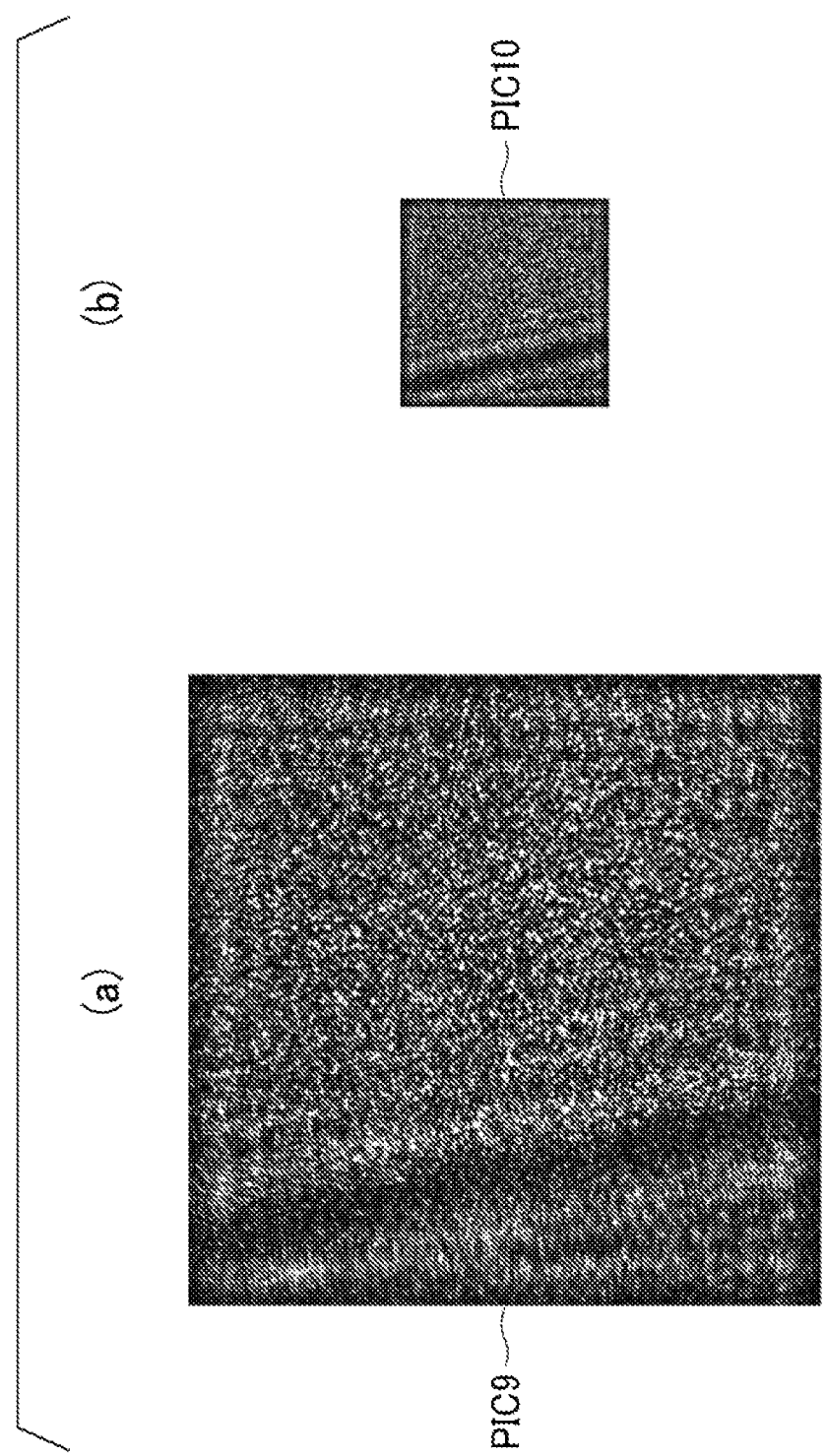
FIG. 18 is a diagram showing another example of a comparison of the number of pixels of captured images.

FIG. 18 is a diagram showing another example of a comparison of the number of pixels of captured images IP. FIG. 18(A) shows an example of a captured image IP (an image PIC9) from the imaging unit 11 when the number of pixels of the imaging element of the imaging unit 11 is the same as the number of scattering sections of the scattering plate MP. FIG. 18(B) shows an example of a captured image IP (an image PIC10) from the imaging unit 11 when the number of pixels of the imaging element of the imaging unit 11 is smaller than the number of scattering sections of the scattering plate MP. Here, as an example of an object having a phase different from a phase of the vicinity (for example, air AIR) of the imaging object OB, a thin glass (for example, a cover glass CG) is set as the imaging object OB. As shown in this example, an angle of view of the captured image IP when the number of pixels of the imaging element is smaller than the number of scattering sections of the scattering plate MP (FIG. 18(B)) is narrower than that when the number of pixels of the imaging element is the same as the number of scattering sections of the scattering plate MP (FIG. 18(A)). That is, when the number of pixels of the imaging element is smaller than the number of scattering sections of the scattering plate MP, the resolution of the captured image IP is low.

Figure 19:
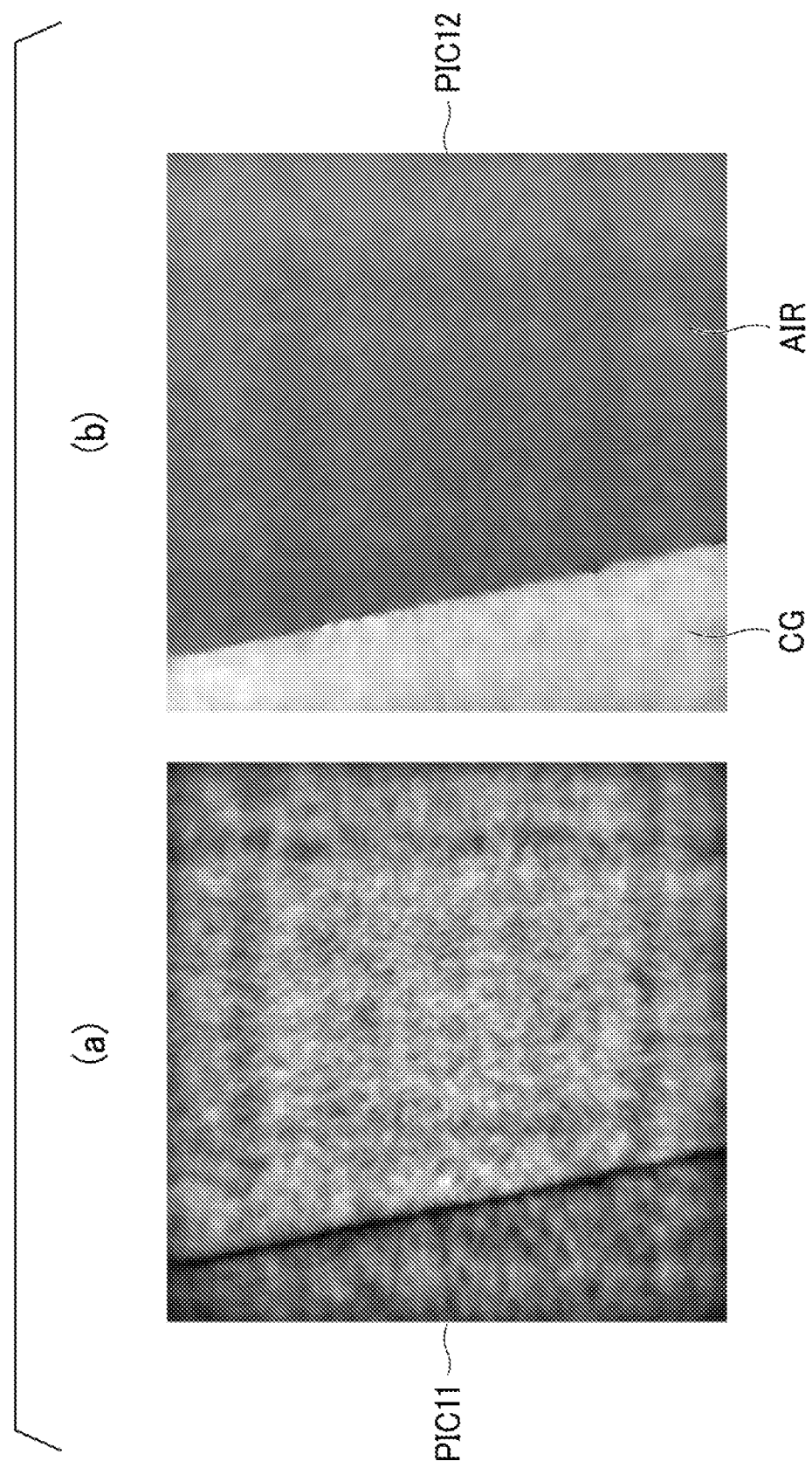
FIG. 19 is a diagram showing an example of an amplitude image and a phase image of scattered light when the number of pixels of the imaging element is the same as the number of scattering sections of the scattering plate.

FIG. 19 is a diagram showing an example of an amplitude image and a phase image of the scattered light SL when the number of pixels of the imaging element is the same as the number of scattering sections of the scattering plate MP. FIG. 19(A) is an example of an amplitude image (an image PIC11) of the scattered light SL when the number of pixels of the imaging element is the same as the number of scattering sections of the scattering plate MP. FIG. 19(B) is an example of a phase image (an image PIC12) of the scattered light SL when the number of pixels of the imaging element is the same as the number of scattering sections of the scattering plate MP. FIG. 19(B) shows the amplitude image and the phase image of the scattered light SL when the number of pixels of the imaging element of the imaging unit 11 is relatively large, i.e., when the resolution is high.

Figure 20:
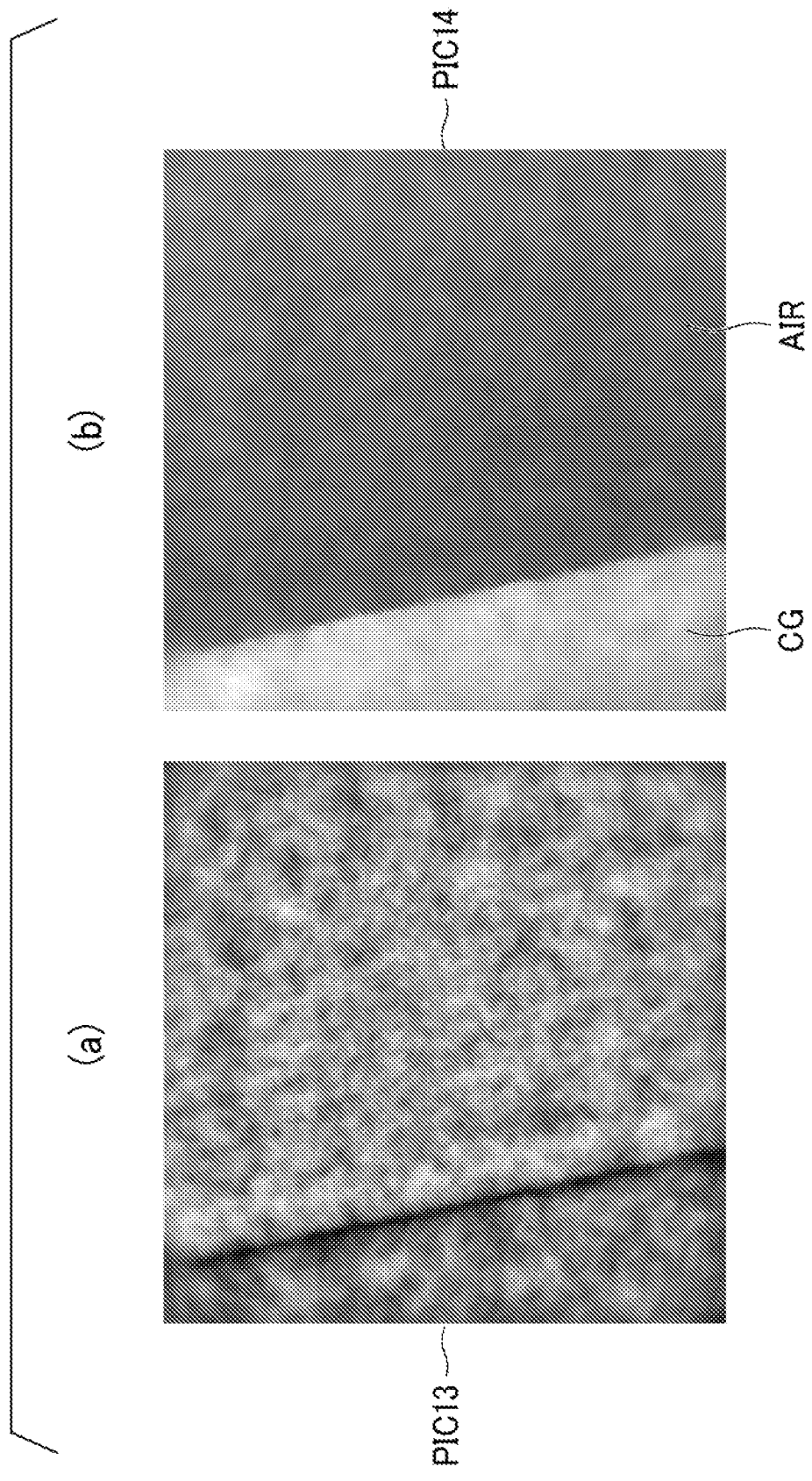
FIG. 20 is a diagram showing an example of an amplitude image and a phase image of scattered light from the generation unit when the number of pixels of the imaging element is smaller than the number of scattering sections of the scattering plate.

FIG. 20 is a diagram showing an example of an amplitude image and a phase image of the scattered light SL from the generation unit 12 when the number of pixels of the imaging element is smaller than the number of scattering divisions of the scattering plate MP. That is, FIG. 20 shows an amplitude image (an image PIC13) and a phase image (an image PIC14) of the scattered light SL when the number of pixels of the imaging element of the imaging unit 11 is relative small, i.e., when the resolution is low. The generation unit 12 generates an amplitude image and a phase image of the scattered light SL according to the above-described (Procedure 2). In the case of (Procedure 2), the generation unit 12 does not interpolate the element of $|g|^2$ as described above. FIG. 20(A) is an example of the amplitude image of the scattered light SL when the element of $|g|^2$ is not interpolated. FIG. 20(B) is an example of a phase image of the scattered light SL when the element of $|g|^2$ is not interpolated.

Even when the resolution of the imaging unit 11 is relatively low (in the case shown in FIG. 20), the amplitude image and the phase image having resolutions equivalent to those when the resolution of the imaging unit 11 is relatively high (in the case shown in FIG. 19) are obtained.

Figure 21:
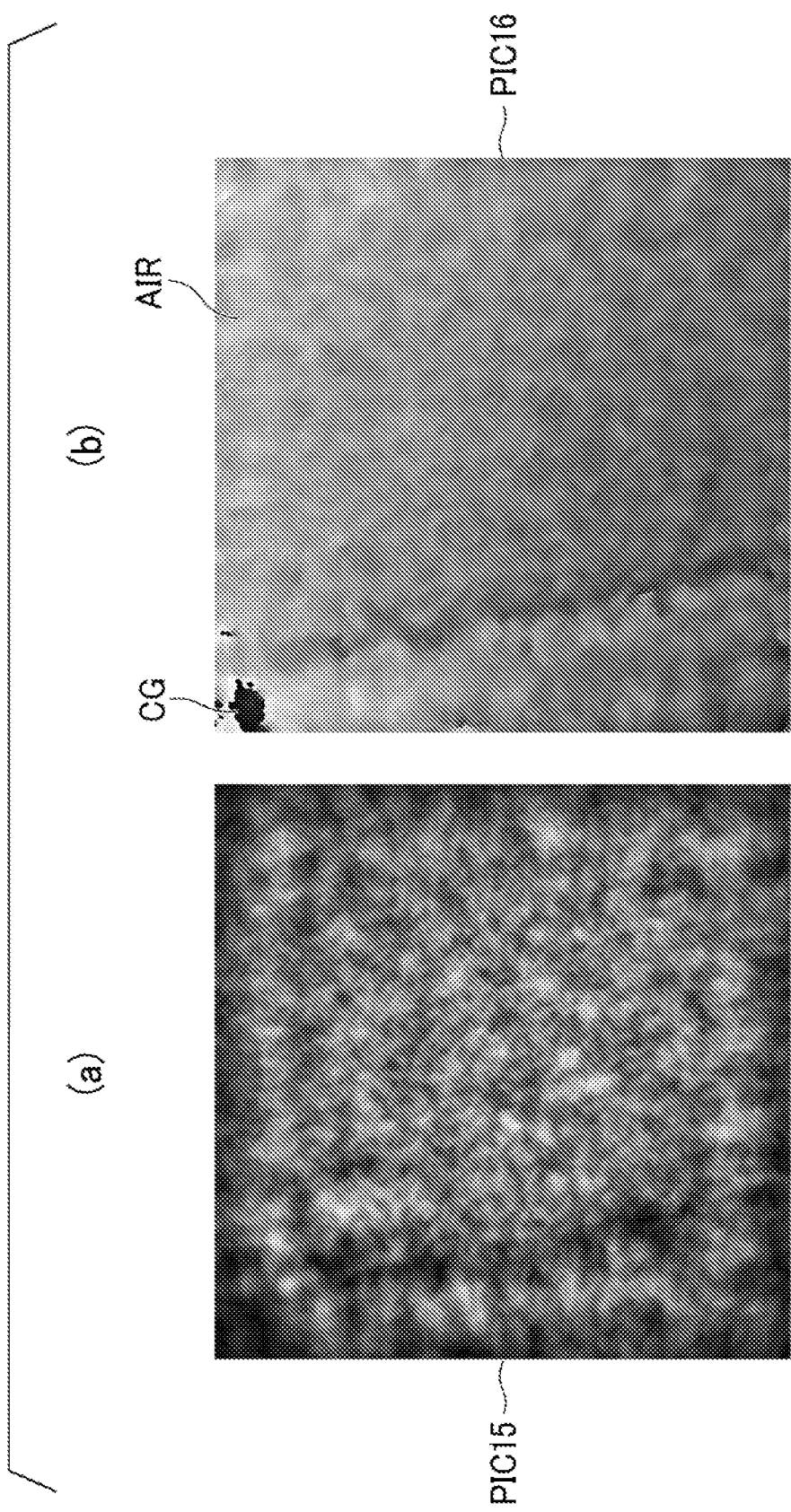
FIG. 21 is a diagram showing an example of an amplitude image and a phase image of scattered light according to a conventional technique.

Here, an example of a result of an arithmetic operation according to the above-described (Procedure 1), i.e., the conventional technique, as an object to be compared is shown in FIG. 21.

FIG. 21 is a diagram showing an example of an amplitude image (an image PIC15) and a phase image (an image PIC16) of the scattered light SL according to the conventional technique. According to the conventional technique, both the amplitude image and the phase image have lower resolutions than those in the case of the generation unit 12 of the present embodiment (the case of FIG. 20).

Figure 22:
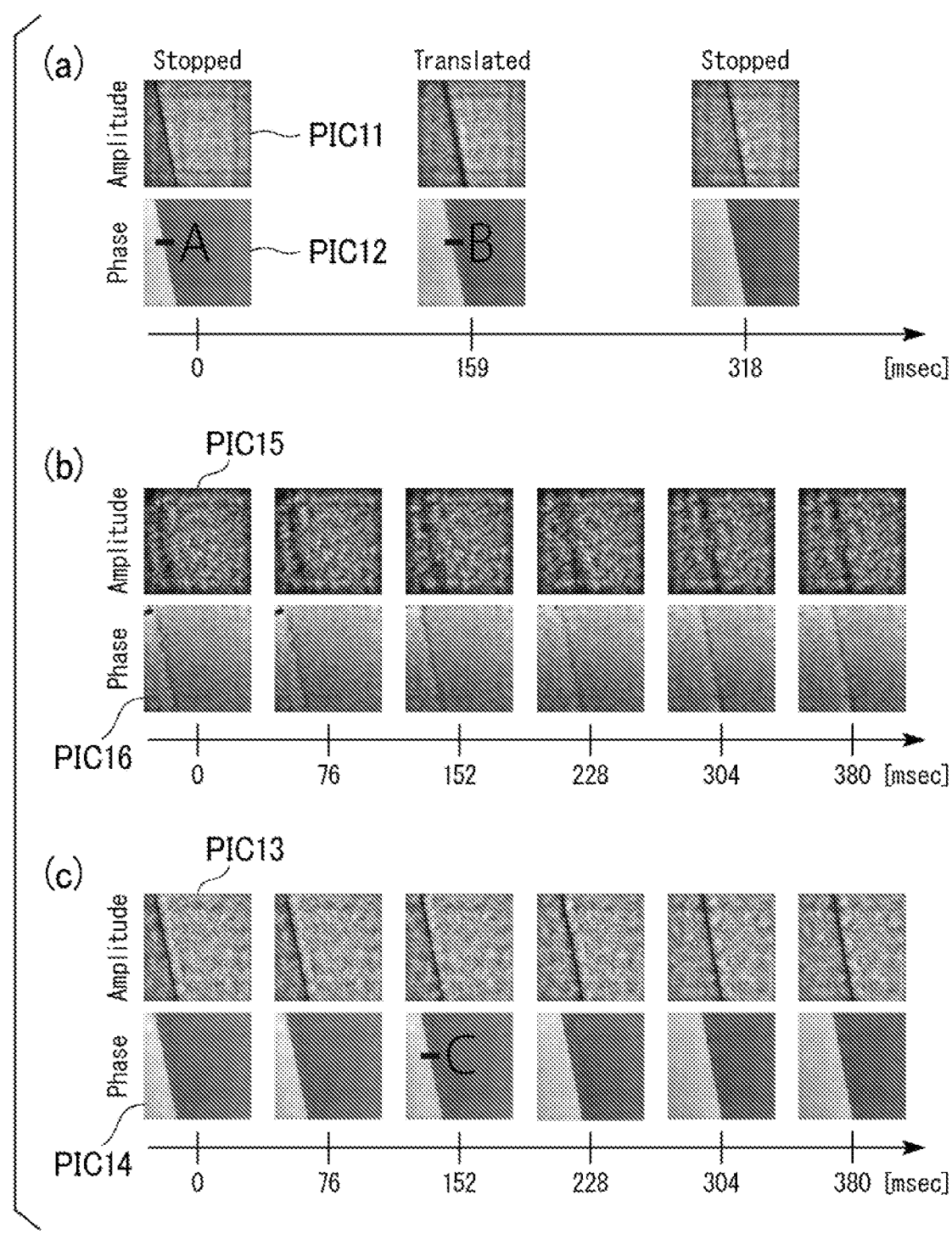
FIG. 22 is a diagram showing another example of an amplitude image and a phase image generated in time series.

FIG. 22 is a diagram showing another example of an amplitude image and a phase image generated in time series. FIG. 22(A) shows an example of an amplitude image and a phase image generated in the condition shown in FIG. 18(A), i.e., when the number of pixels of the imaging element of the imaging unit 11 is the same as the number of scattering sections of the scattering plate MP. FIG. 22(B) and FIG. 22(C) all show an example of an amplitude image and a phase image generated in the condition shown in FIG. 18(B), i.e., when the number of pixels of the imaging element of the imaging unit 11 is smaller than the number of scattering sections of the scattering plate MP. Here, FIG. 22(B) shows an example of an amplitude image and a phase image generated according to the above-described (Procedure 1), i.e., the conventional procedure. FIG. 22(C) shows an example of an amplitude image and a phase image generated according to the above-described (Procedure 2), i.e., a procedure adopted by the generation unit 12 of the present embodiment.

As described above, the resolution of the imaging unit 11 of the present embodiment is lower than the resolution of the arithmetic sparsity constraint operation of the generation unit 12. That is, the number of pixels of the imaging unit 11 of the present embodiment is smaller than the number of scattering sections of the scattering plate MP. In other words, the number of pixels of the imaging element of the imaging unit 11 is smaller than that when the number of pixels of the imaging element is the same as the number of scattering sections of the scattering plate MP. The imaging unit 11 of the present embodiment has a higher imaging operation speed (FIG. 22(C)) than when the number of pixels of the imaging element is the same as the number of scattering sections of the scattering plate MP (FIG. 22(A)).

Resolutions of the amplitude image and the phase image (FIG. 22(B)) generated according to (Procedure 1) that is the conventional technique are lower than resolutions of the amplitude image and the phase image (FIG. 22(C)) generated according to (Procedure 2). That is, the generation unit 12 of the present embodiment can generate an amplitude image and a phase image having higher resolutions than those of the conventional technique.

Figure 23:
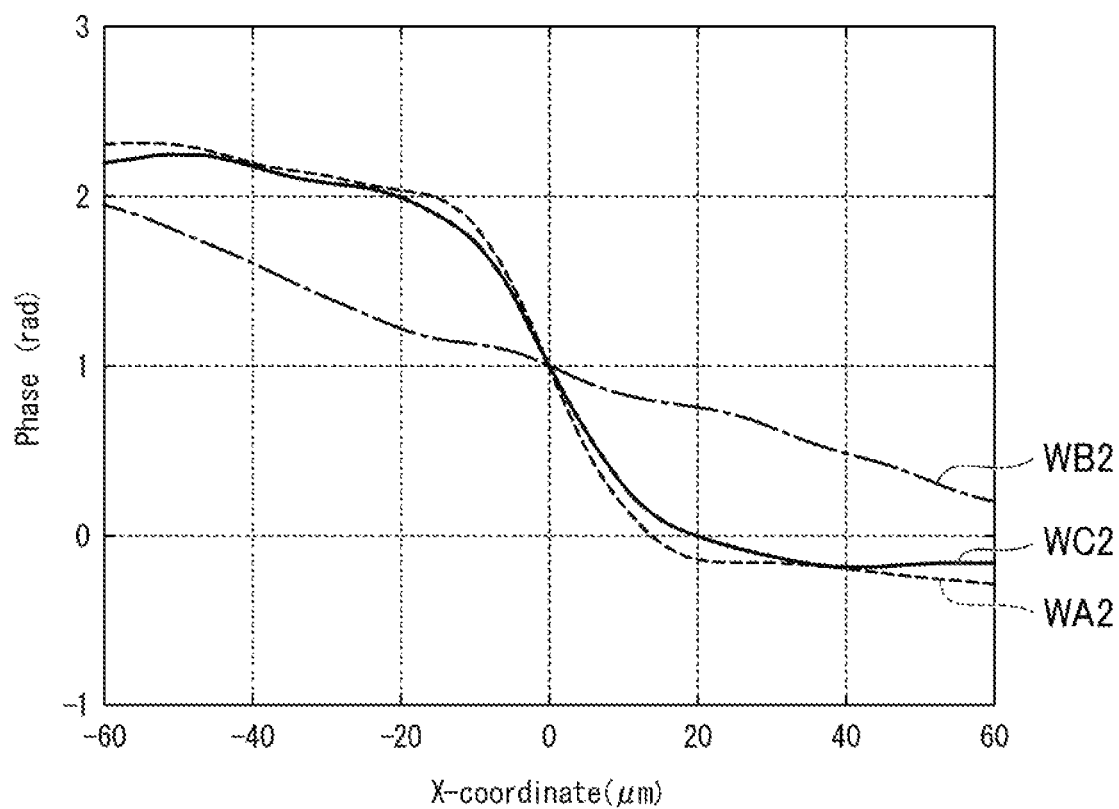
FIG. 23 is a diagram showing an example of a result of comparing resolutions of phase images.

FIG. 23 is a diagram showing an example of a result of comparing resolutions of phase images. In FIG. 23, a relationship between a coordinate of the imaging object OB indicated by a phase image and a phase is shown. Waveforms when the imaging element has higher resolution than the imaging element of the imaging unit 11 of the present embodiment are shown as waveform W2A and W2B.

The waveform W2A thereof indicates the resolution of the phase image when the imaging object OB is stopped in FIG. 22(A). The waveform W2A is a reference example of the resolution of the phase image.

The waveform W2B shows the resolution of the phase image when the imaging object OB moves in FIG. 22(A). When the imaging element has resolution higher than that of the imaging element of the imaging unit 11 of the present embodiment, the imaging operation speed is slow, so that the image is blurred. This waveform W2B shows that a change in the phase in a reference coordinate (0 (zero) in this example) is not clearer than the waveform W2A and that the resolution is lower than that of the reference example.

In the case of the resolution of the imaging unit 11 of the present embodiment, the waveform when the phase image is generated according to the above-described (Procedure 2), i.e., a technique adopted by the generation unit 12 of the present embodiment, (i.e., in the case of FIG. 22(C)) is shown as a waveform W2C. The waveform W2C indicates the resolution of the phase image when the imaging object OB moves in FIG. 22(C). This waveform W2C shows that the change in the phase is clearer than that of the above-described waveform W2B, i.e., that the resolution is improved, and that the resolution equivalent to that of the reference example is obtained even when the imaging object OB moves.

As described above, the electromagnetic wave phase/amplitude generation device 100-2 of the present embodiment can improve resolutions of an amplitude image and a phase image by increasing a speed of an operation according to a decrease in the number of pixels of the imaging unit 11 and generating the amplitude image and the phase image without interpolating the pixel value. That is, the electromagnetic wave phase/amplitude generation device 100-2 of the present embodiment can achieve both a high-speed operation and improved resolutions of the generated amplitude image and phase image.

Although the embodiments of the present invention have been described above in detail with reference to the drawings, the specific configuration is not limited to the embodiments and modifications may be appropriately made without departing from the scope and spirit of the present invention.

Also, the above-described electromagnetic wave phase/amplitude generation device 100 internally includes a computer. Processes of various types of processing of the above-described device are stored in a computer-readable recording medium in the form of the program and various types of processing described above are performed by the computer reading and executing this program. Here, the computer-readable recording medium refers to a magnetic disk, a magneto-optical disc, a CD-ROM, a DVD-ROM, a semiconductor memory, or the like. Also, a computer program may be delivered to a computer through a communication circuit and the computer receiving the delivered computer program may execute the program.

Also, the above-described program may be a program for implementing some of the above-described functions. Further, the above-described program may be a program capable of implementing the above-described functions in combination with a program already recorded on the computer system, i.e., a so-called differential file (differential program).

REFERENCE SIGNS LIST

10 Terminal device
11 Imaging unit
12 Generation unit
13 Display unit
14 Operation detection unit
15 Image acquisition unit
16 Storage unit
100 Electromagnetic wave phase/amplitude generation device
RL Radiation unit
REW Radiated light
SL Scattered light
MP Scattering plate

What is claimed is:

1. A system for imaging an object, comprising:
a radiation unit comprising at least one light source and at least one scattering plate, wherein the radiation unit is configured to direct electromagnetic waves having a random spatial distribution of amplitudes or phases towards the object;
an imaging unit configured to form an image of the object by detecting one or more scattered electromagnetic waves generated upon the object scattering the radiated electromagnetic waves; and
a generation unit configured to generate information indicating at least a phase and an amplitude of the electromagnetic waves scattered by the object based at least in part on the image formed using the imaging unit and a radiation pattern of the electromagnetic waves radiating the object.

2. The system of claim 1, wherein the generation unit is configured to generate the information indicating at least the phase and the amplitude of the electromagnetic waves by iteratively generating the phase and amplitude information based at least in part on the image of the object.

3. The system of claim 1, further comprising a storage unit configured to store information associated with the radiated electromagnetic waves.

4. The system of claim 1, wherein the generation unit is configured to generate the information indicating at least the phase and the amplitude of the electromagnetic waves at a resolution that is higher than an imaging resolution of the imaging unit by iteratively generating the information indicating at least the phase and the amplitude of the electromagnetic waves.

5. The system of claim 1, wherein the at least one scattering plate comprises a spatial light modulator configured to modulate a state or a property of the electromagnetic waves.

6. The system of claim 1, wherein the at least one light source comprises one or more members selected from the group consisting of a laser light source, a semiconductor laser light source, and a light emitting diode (LED) light source.

7. The system of claim 5, wherein the at least one scattering plate is configured to modulate the state or the property of the electromagnetic waves based on a degree of scattering associated with one or more divided regions of the at least one scattering plate.

8. The system of claim 1, wherein the electromagnetic waves comprise one or more members selected from the group consisting of visible rays, X rays, ultraviolet rays, infrared rays, terahertz waves, millimeter waves, and microwaves.

9. The system of claim 1, further comprising a display unit configured to display reconstructed information about an image of the object based at least in part on the information generated by the generation unit.

10. The system of claim 1, wherein the at least one scattering plate is configured to radiate scattered light to the object, wherein the scattered light has a scattered light intensity corresponding to a light scattering rate that differs according to each region of the at least one scattering plate.

11. The system of claim 1, wherein the at least one scattering plate comprises one or more regions configured to change (i) an intensity of light radiated from the at least one light source or (ii) a degree of light scattering.

12. The system of claim 11, wherein a first region of the one or more regions is configured to change the intensity of light or the degree of light scattering differently than a second region of the one or more regions.

13. The system of claim 1, wherein the at least one scattering plate comprises an optical element configured to modulate at least one of an intensity of the electromagnetic waves, the amplitude of the electromagnetic waves, and the phase of the electromagnetic waves.

14. The system of claim 1, wherein the generation unit is further configured to generate the information indicating at least the phase and the amplitude of the electromagnetic waves scattered by the object based at least in part on an intensity of one or more of the electromagnetic waves.

15. A method for imaging an object, comprising:
    (a) directing electromagnetic waves having a random spatial distribution of amplitudes or phases towards the object;
    (b) detecting scattered electromagnetic waves generated by the object scattering the radiated electromagnetic waves;
    (c) forming an image of the object from the scattered electromagnetic waves; and
    (d) generating information indicating at least a phase and an amplitude of the electromagnetic waves scattered by the object based at least in part on the image of the object and a radiation pattern of the electromagnetic waves radiating the object.

16. The method of claim 15, further comprising iteratively generating the phase and amplitude information based at least in part on the captured image generated by the imaging unit.

17. The method of claim 15, further comprising generating the information indicating at least the phase and the amplitude of the electromagnetic waves scattered by the object based at least in part on an intensity of one or more of the electromagnetic waves.

18. A non-transitory computer-readable medium comprising machine-executable code that, upon execution by one or more computer processors, implements a method comprising:
    (a) directing electromagnetic waves having a random spatial distribution of amplitudes or phases towards an object;
    (b) detecting scattered electromagnetic waves generated by the object scattering the radiated electromagnetic waves;
    (c) forming an image of the object from scattered electromagnetic waves; and
    (d) generating information indicating at least a phase and an amplitude of the electromagnetic waves scattered by the object based at least in part on the image of the object and a radiation pattern of the electromagnetic waves radiating the object.

19. The non-transitory computer-readable medium of claim 18, wherein the method further comprises iteratively generating the phase and amplitude information based at least in part on the image generated by the imaging unit.

20. The non-transitory computer-readable medium of claim 18, wherein the method further comprises generating the information indicating at least the phase and the amplitude of the electromagnetic waves scattered by the object based at least in part on an intensity of one or more of the electromagnetic waves.

* * * * *